(12) United States Patent
Mori et al.

(10) Patent No.: US 12,199,625 B2
(45) Date of Patent: Jan. 14, 2025

(54) OSCILLATION DEVICE AND PLL CIRCUIT

(71) Applicant: SONY SEMICONDUCTOR SOLUTIONS CORPORATION, Kanagawa (JP)

(72) Inventors: Yoshiaki Mori, Kanagawa (JP); Tetsuya Fujiwara, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 18/044,410

(22) PCT Filed: Aug. 16, 2021

(86) PCT No.: PCT/JP2021/029944
§ 371 (c)(1),
(2) Date: Mar. 8, 2023

(87) PCT Pub. No.: WO2022/059398
PCT Pub. Date: Mar. 24, 2022

(65) Prior Publication Data
US 2023/0361777 A1    Nov. 9, 2023

(30) Foreign Application Priority Data

Sep. 18, 2020  (JP) .................................. 2020-157797

(51) Int. Cl.
*H03L 7/099* (2006.01)
*H03K 3/03* (2006.01)
*H03K 5/134* (2014.01)

(52) U.S. Cl.
CPC ......... *H03L 7/0992* (2013.01); *H03K 3/0315* (2013.01); *H03K 5/134* (2014.07)

(58) Field of Classification Search
CPC ..... H03L 7/0992; H03L 7/0995; H03L 7/099; H03L 7/08; H03K 3/0315; H03K 5/134; H03K 3/011; H03K 5/133
See application file for complete search history.

(56) References Cited

U.S. PATENT DOCUMENTS

2015/0145608 A1*  5/2015  Katyal .................... G05F 3/262
                                                        331/57
2017/0062027 A1   3/2017  Todi et al.

FOREIGN PATENT DOCUMENTS

| JP | 07-046113 A   | 2/1995 |
| JP | 2002-050945 A | 2/2002 |
| JP | 2002-290230 A | 10/2002 |

(Continued)

OTHER PUBLICATIONS

International Search Report and Written Opinion of PCT Application No. PCT/JP2021/029944, issued on Sep. 7, 2021, 12 pages of ISRWO.

*Primary Examiner* — Jung Kim
(74) *Attorney, Agent, or Firm* — CHIP LAW GROUP

(57) ABSTRACT

There is provided an oscillation device includes multiple delay elements that each sequentially delay an input signal, and return at least some of the delayed signals to a preceding stage to generate an oscillation signal. The oscillation device further includes a first control terminal that inputs, to the multiple delay elements, a direct current control signal for collectively controlling direct current voltage levels of the input signal to be input in plural number to the multiple delay elements.

19 Claims, 35 Drawing Sheets

(56) References Cited

FOREIGN PATENT DOCUMENTS

| | | |
|---|---|---|
| JP | 3506229 B2 | 3/2004 |
| JP | 2010-041275 A | 2/2010 |
| JP | 2011-166461 A | 8/2011 |
| JP | 2013-207339 A | 10/2013 |

\* cited by examiner

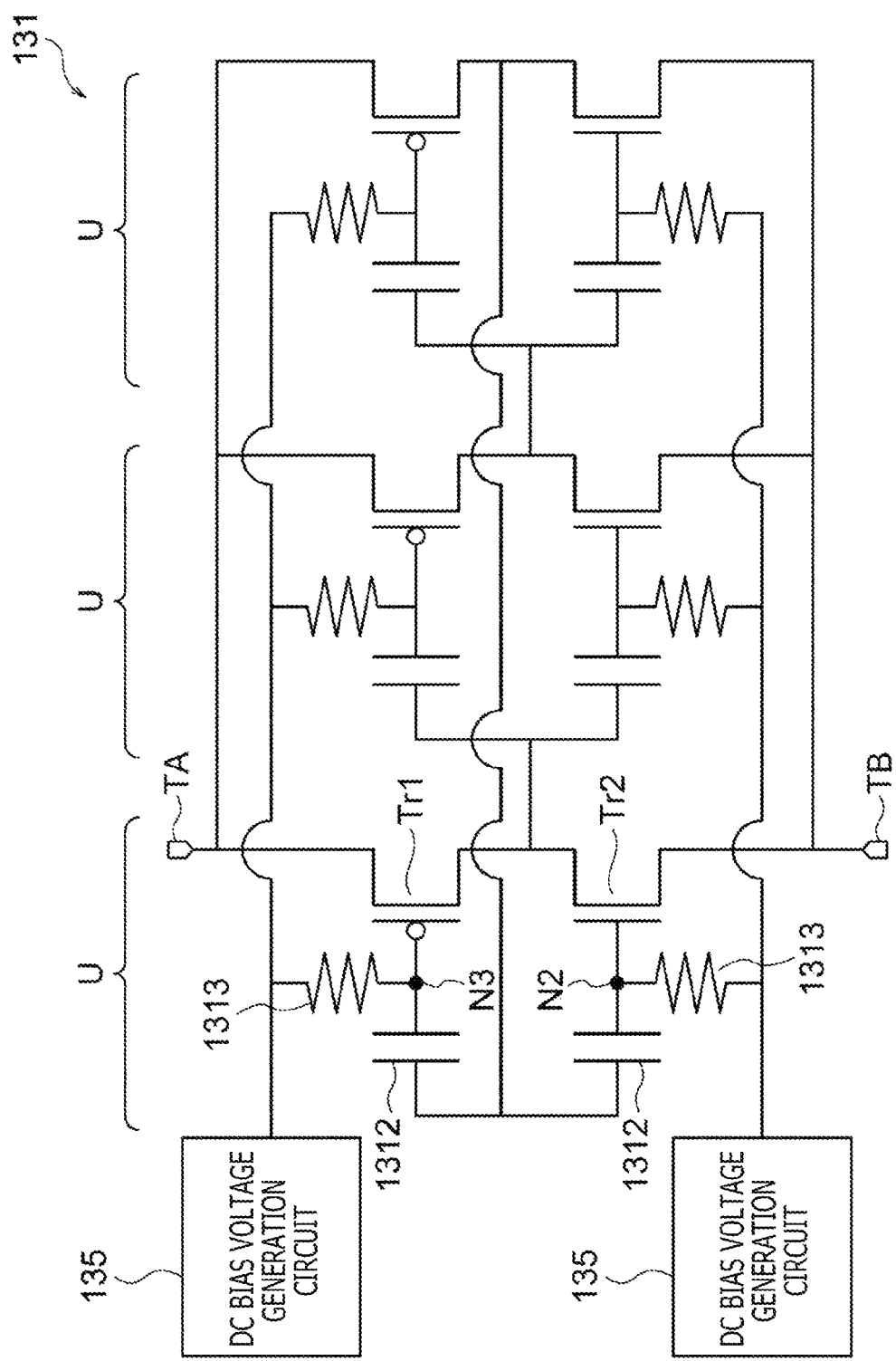

FIG. 9

| | WHEN TRANSISTOR CAPABILITY IS DESIRED TO BE LOWERED = WHEN OSCILLATION FREQUENCY IS DESIRED TO BE DECREASED | WHEN TRANSISTOR CAPABILITY IS DESIRED TO BE RAISED = WHEN OSCILLATION FREQUENCY IS DESIRED TO BE INCREASED |
|---|---|---|
| nMOS GATE | DECREASE BIAS VOLTAGE | INCREASE BIAS VOLTAGE |
| pMOS GATE | INCREASE BIAS VOLTAGE | DECREASE BIAS VOLTAGE |

F I G . 1 0

|  | | nMOS | |
|---|---|---|---|
|  | | Slow | Fast |
| pMOS | Slow | 2 | 4 |
|  | Fast | 1 | 3 |

F I G. 1 8

| | EMBODIMENT (a) | | EMBODIMENT (b) | |
|---|---|---|---|---|
| CURRENT SOURCE | WHEN BIAS VOLTAGE IS DESIRED TO BE DECREASED | WHEN BIAS VOLTAGE IS DESIRED TO BE INCREASED | WHEN BIAS VOLTAGE IS DESIRED TO BE DECREASED | WHEN BIAS VOLTAGE IS DESIRED TO BE INCREASED |
| nMOS | DECREASE CURRENT | INCREASE CURRENT | INCREASE CURRENT | DECREASE CURRENT |
| | INCREASE PARALLEL NUMBER | DECREASE PARALLEL NUMBER | INCREASE PARALLEL NUMBER | DECREASE PARALLEL NUMBER |
| pMOS | DECREASE PARALLEL NUMBER | INCREASE PARALLEL NUMBER | DECREASE PARALLEL NUMBER | INCREASE PARALLEL NUMBER |
| RESISTANCE ELEMENT | DECREASE RESISTANCE VALUE | INCREASE RESISTANCE VALUE | INCREASE RESISTANCE VALUE | DECREASE RESISTANCE VALUE |

FIG. 21

OSCILLATION DEVICE AND PLL CIRCUIT

CROSS REFERENCE TO RELATED APPLICATIONS

This application is a U.S. National Phase of International Patent Application No. PCT/JP2021/029944 filed on Aug. 16, 2021, which claims priority benefit of Japanese Patent Application No. JP 2020-157797 filed in the Japan Patent Office on Sep. 18, 2020. Each of the above-referenced applications is hereby incorporated herein by reference in its entirety.

TECHNICAL FIELD

An embodiment according to the present disclosure relates to an oscillation device and a PLL circuit.

BACKGROUND ART

A PLL (Phase Locked Loop) circuit is a type of electronic circuits used in various fields, such as a wireless or wired transceiver and digital system clock generation. For example, such a PLL circuit which needs to be equipped to generate oscillation signals, such as system clocks, in a chip requires an oscillator core for generating oscillation signals according to phase difference information which indicates a phase difference from a reference clock. Examples of the oscillator core include a voltage controlled oscillator (VCO (Voltage Controlled Oscillator)) provided in an analog PLL circuit and a digital controlled oscillator (DCO (Digital Controlled Oscillator)) provided in a digital PLL circuit. Each of the VCO and the DCO adopts either a ring oscillator or an LC oscillator, which are oscillator types roughly divided by an oscillation mechanism.

Moreover, there is a demand in recent years for further improvement of a maximum rate of a PLL circuit to achieve requirements for higher-speed signal processing, transfer of a larger volume of data, and the like. Meanwhile, a PLL circuit of such a type operable even at a low data rate is required in some cases to further cover upper compatibility. Accordingly, for a PLL circuit, there is a demand for such an oscillator core capable of not only achieving high-speed oscillation operations, but also varying an oscillation frequency in a wide range.

An LC oscillator typically has a narrow frequency variable width. Accordingly, in a case where a frequency variable width is desired to be widened by a single oscillator, a ring oscillator is often selected (see PTL 1).

CITATION LIST

Patent Literature

[PTL 1]
Japanese Patent No. 3506229

SUMMARY

Technical Problem

However, a current-voltage conversion gain gm contributing to an oscillation frequency of a ring oscillator is considerably dependent on the capability of transistors constituting a CMOS (Complementary Metal Oxide Semiconductor) inverter, for example. In addition, a transistor capability considerably varies according to processing, power source voltage, and temperature. This variation in the transistor capability according to processing, power source voltage, and temperature here is often expressed as a variation in threshold voltage. The considerable variation in the transistor capability consequently causes considerable characteristic variation of the ring oscillator.

In the presence of this characteristic variation of the ring oscillator, a wide-range oscillation frequency variable width is difficult to design when the ring oscillator is applied to an oscillator core of a PLL circuit. In addition, a maximum oscillation frequency securable by the ring oscillator is limited under the condition of a lowest transistor capability. Accordingly, a physical limit produced by processing is inherently imposed on oscillation operations at a high frequency. As described above, in the case of the conventional PLL circuit, oscillator characteristics, such as a maximum oscillation frequency, are not easily adjustable due to a limitation imposed by processing or the like.

Accordingly, the present disclosure provides an oscillation device and a PLL circuit capable of adjusting oscillator characteristics.

Solution to Problem

For solving the abovementioned problems, provided according to the present disclosure is an oscillation device including multiple delay elements that each sequentially delay an input signal, and return at least some of the delayed signals to a preceding stage to generate an oscillation signal, and a first control terminal that inputs, to the multiple delay elements, a direct current control signal for collectively controlling direct current voltage levels of the input signal to be input in plural number to the multiple delay elements.

Multiple capacitors connected to input nodes of the multiple delay elements to cut off direct current signal components contained in the multiple input signals may be further provided.

Each of the delay elements may include a transistor having a gate at which the direct current voltage level is adjusted according to the direct current control signal.

The multiple delay elements may include multiple logical inverting circuits connected in a ring shape, and direct current voltage levels of multiple input signals to be input to the multiple logical inverting circuits may be collectively controlled according to the direct current control signal.

Each of the logical inverting circuits may have a first transistor and a second transistor, each of the first and second transistors being a transistor of a conductive type different from each other and cascode-connected between a first reference voltage node and a second reference voltage node, and a direct current voltage level at a gate of either the first transistor or the second transistor may be set according to the direct current control signal.

A capacitor connected to and between a gate of the first transistor and a gate of the second transistor to cut off a direct current signal component contained in an output signal from any one of the other logical inverting circuits may be further provided.

A direct current control signal generation unit that generates the direct current control signal according to a drive capability of at least one transistor included in the delay elements may be further provided.

The direct current control signal generation unit may adjust a voltage level of the direct current control signal to be input to a gate of the transistor, to adjust the drive capability of the transistor.

The direct current control signal generation unit may include a current source and a third transistor that is diode-connected, the current source and the third transistor being connected in series between a first reference voltage node and a first node, a fourth transistor that is diode-connected and connected to and between the first reference voltage node and the first node, and a resistance element connected to and between the first node and a second reference voltage node, and the direct current control signal generation unit may output the direct current control signal from a gate and a drain of the third transistor that is diode-connected.

The direct current control signal generation unit may control the direct current voltage level of the direct current control signal by controlling at least one of a current flowing in the current source, a parallel number of the third transistor, a parallel number of the fourth transistor, and a resistance of the resistance element.

In a case where the third transistor and the fourth transistor are an n-type MOS transistor and a p-type MOS transistor, respectively, the direct current control signal generation unit may lower the direct current voltage level by decreasing the current flowing in the current source, or raise the direct current voltage level by increasing the current flowing in the current source, and in a case where the third transistor and the fourth transistor are a p-type MOS transistor and an n-type MOS transistor, respectively, the direct current control signal generation unit may lower the direct current voltage level by increasing the current flowing in the current source, or raise the direct current voltage level by decreasing the current flowing in the current source.

In a case where the third transistor and the fourth transistor are an n-type MOS transistor and a p-type MOS transistor, respectively, the direct current control signal generation unit may lower the direct current voltage level by increasing the parallel number of the n-type MOS transistor and decreasing the parallel number of the p-type MOS transistor, or raise the direct current voltage level by decreasing the parallel number of the n-type MOS transistor and increasing the parallel number of the p-type MOS transistor, and in a case where the third transistor and the fourth transistor are a p-type MOS transistor and an n-type MOS transistor, respectively, the direct current control signal generation unit may raise the direct current voltage level by decreasing the parallel number of the n-type MOS transistor and increasing the parallel number of the p-type MOS transistor, or lower the direct current voltage level by increasing the parallel number of the n-type MOS transistor and decreasing the parallel number of the p-type MOS transistor.

An oscillation frequency control unit that controls an oscillation frequency of the oscillation signal may be further provided. In this case, the oscillation frequency control unit may include a fifth transistor that controls a current flowing in the current source, and a sixth transistor that applies a drain current proportional to a drain current of the fifth transistor, a delay time of each of the multiple delay elements may vary according to the drain current of the sixth transistor, and the oscillation frequency control unit may control the current flowing in the current source by controlling a gate voltage of the fifth transistor, and control the oscillation frequency of the oscillation signal by controlling the delay times of the multiple delay elements.

The current flowing in the current source and the drain current of the sixth transistor may be controlled according to the gate voltage of the fifth transistor, and a drain current of the third transistor may be controlled according to the current flowing in the current source.

Each of the third transistor and the fourth transistor may have characteristics identical with or similar to characteristics of the transistors contained in the delay elements.

A second control terminal that inputs an alternating current control signal that controls alternating current voltage levels of the input signals to be input to the multiple delay elements may be further provided.

A noise component detection unit that detects a noise component of a power source voltage supplied to the multiple delay elements may be further provided, and an alternating current control signal generation unit that generates the alternating current control signal as a signal for cancelling the noise component may be further provided.

A noise component detection unit that detects a noise component of the oscillation signal output from the delay elements may be further provided, and an alternating current control signal generation unit that generates the alternating current control signal as a signal for cancelling the noise component may be further provided.

Provided according to the present disclosure is a PLL circuit including an oscillation device that controls an oscillation frequency of an oscillation signal according to a phase difference from a reference signal, and a phase comparator that detects a phase difference between the reference signal and the oscillation signal, in which the oscillation device includes multiple delay elements that each sequentially delay an input signal, and return at least some of the delayed signals to a preceding stage to generate the oscillation signal, and a first control terminal that inputs, to the multiple delay elements, a direct current control signal for collectively controlling direct current voltage levels of the input signal to be input in plural number to the multiple delay elements.

FIG. 8C is a circuit diagram depicting a modification of connection between the ring oscillator and the bias voltage generation circuit.

FIG. 9 is a diagram presenting an example of a relation between an increase or decrease of an oscillation frequency and an increase or decrease of a direct current bias voltage depicted in FIGS. 8A, 8B, and 8C.

FIG. 10 is a diagram presenting an example of a bias voltage corresponding to a transistor capability.

FIG. 18 is a diagram presenting an example of a relation between operations of variable mechanisms depicted in FIGS. 17A and 17B and a bias voltage.

FIG. 21 is a circuit diagram depicting an example of a configuration of the VCO.

DESCRIPTION OF EMBODIMENT

An embodiment of an oscillation device and a PLL (Phase locked Loop) circuit will hereinafter be described with reference to the drawings. While a main part of configurations of the oscillation device and the PLL circuit will mainly be described hereinafter, the oscillation circuit and the PLL circuit may each have configuration parts and functions not depicted or described. It is not intended that the configuration parts and the functions not depicted or described in the following description should be excluded.

Moreover, the drawings are only schematical or conceptual illustrations, and hence, ratios and the like of respective parts are not necessarily identical to actual ratios and the like. In the description and the drawings, elements similar to those described previously with reference to the drawings already mentioned will be given identical reference signs, and detailed description of those elements will be omitted where appropriate.

[Configuration Example of PLL Circuit]

Figure 1:
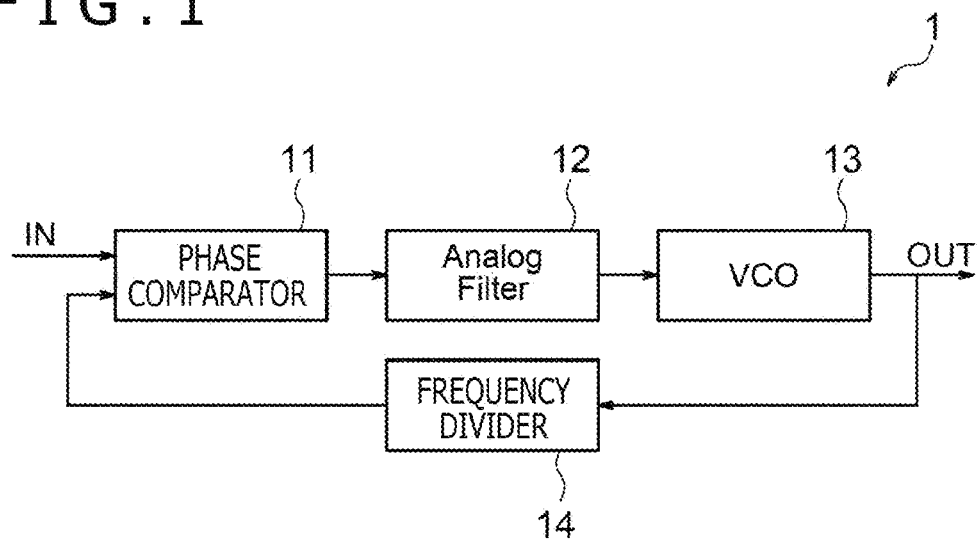
FIG. 1 is a block diagram depicting an example of a configuration of a PLL circuit to which the technology according to the present disclosure is applied.

FIG. 1 is a block diagram depicting an example of a configuration of a PLL circuit 1 to which the technology according to the present disclosure is applied. The PLL circuit 1 depicted in FIG. 1 is an analog PLL circuit.

The PLL circuit 1 includes a phase comparator 11, an analog loop filter 12, a voltage controlled oscillator (VCO (Voltage Controlled Oscillator)) 13, and a frequency divider 14.

The VCO 13 as an oscillation device controls an oscillation frequency according to a phase difference from a reference signal. Moreover, the VCO 13 is an oscillator which controls an oscillation frequency by voltage control.

The phase comparator 11 detects a phase difference between a reference signal and an oscillation signal.

In the PLL circuit 1, the phase comparator 11 compares phases of an input signal and a feedback clock (hereinafter referred to as an FB), converts a phase difference into a voltage, and outputs this voltage. For example, the analog loop filter 12 reduces unnecessary short-cycle fluctuation by using a low-pass filter. The VCO 13 generates a clock signal which has a frequency corresponding to a voltage signal, and outputs the generated clock signal to a following stage. The frequency divider 14 generates an FB by dividing the frequency of the clock signal received from the VCO 13, and returns the generated FB to the phase comparator 11. The PLL circuit 1 as an analog PLL circuit performs feedback control in the manner described above to match phases of the input signal and the FB.

Figure 2:
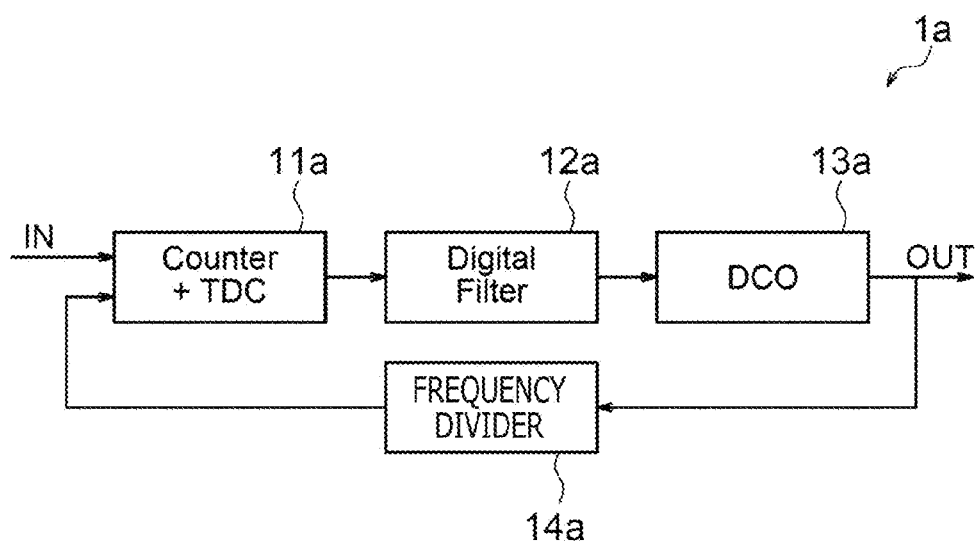
FIG. 2 is a block diagram depicting a modification of the configuration of the PLL circuit to which the technology according to the present disclosure is applied.

FIG. 2 is a block diagram depicting a modification of the configuration of the PLL circuit 1. A PLL circuit 1a depicted in FIG. 2 is a digital PLL circuit.

The PLL circuit 1a includes a time-to-digital converter (TDC (Time-to-digital converter)) 11a as a phase comparator, a digital loop filter 12*a*, a digital controlled oscillator (DCO (Digital Controlled Oscillator)) 13*a*, and a frequency divider 14*a*.

The DCO 13*a* as an oscillation device is an oscillator which controls an oscillation frequency by digital control.

[Configuration Example of VCO and DCO]

Figure 3A:
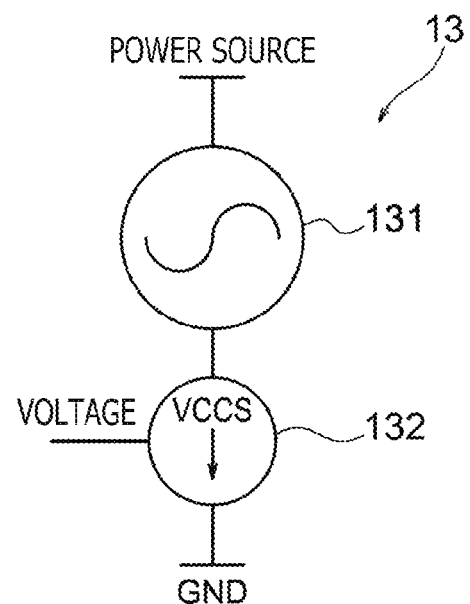
FIG. 3A is a block diagram depicting an example of a configuration of a VCO.

FIG. 3A is a block diagram depicting an example of a configuration of the VCO 13.

The VCO 13 includes a ring oscillator 131 and a voltage controlled current source (VCCS (Voltage Controlled Current Source)) 132.

In the example depicted in FIG. 3A, the ring oscillator 131 and the VCCS 132 are connected in series between a power source and the ground. In addition, the ring oscillator 131 is connected to the power source side, while the VCCS 132 is connected to the ground side.

Figure 3B:
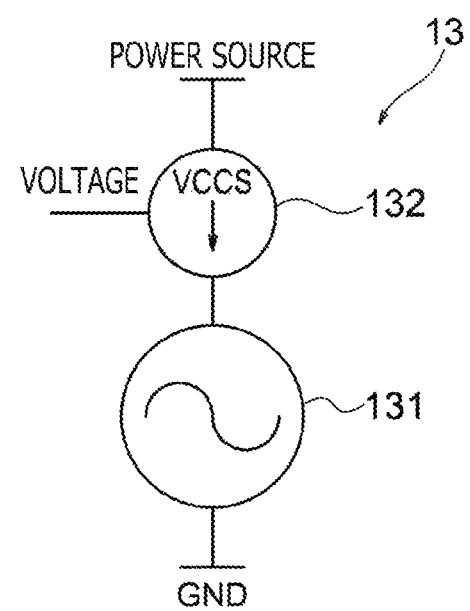
FIG. 3B is a block diagram depicting a modification of the configuration of the VCO.
Figure 3C:
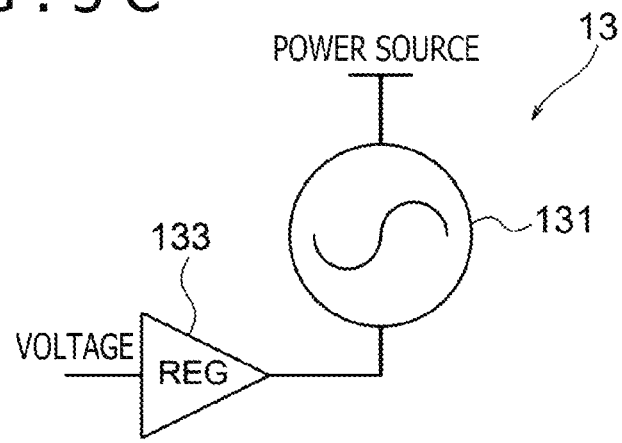
FIG. 3C is a block diagram depicting a modification of the configuration of the VCO.
Figure 3D:
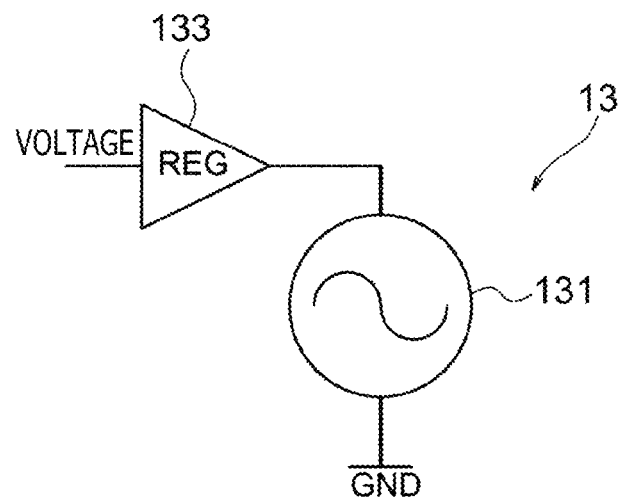
FIG. 3D is a block diagram depicting a modification of the configuration of the VCO.

FIGS. 3B, 3C, and 3D are block diagrams each depicting a modification of the configuration of the VCO 13.

In the example depicted in FIG. 3B, the ring oscillator 131 is connected to the ground side, while the VCCS 132 is connected to the power source side.

In the examples depicted in FIGS. 3C and 3D, the VCO 13 includes the ring oscillator 131 and a voltage regulator (REG) 133. In the example depicted in FIG. 3C, the ring oscillator 131 is connected to and between the power source and the REG 133. In the example depicted in FIG. 3D, the ring oscillator 131 is connected to and between the REG 133 and the ground.

Figure 3E:
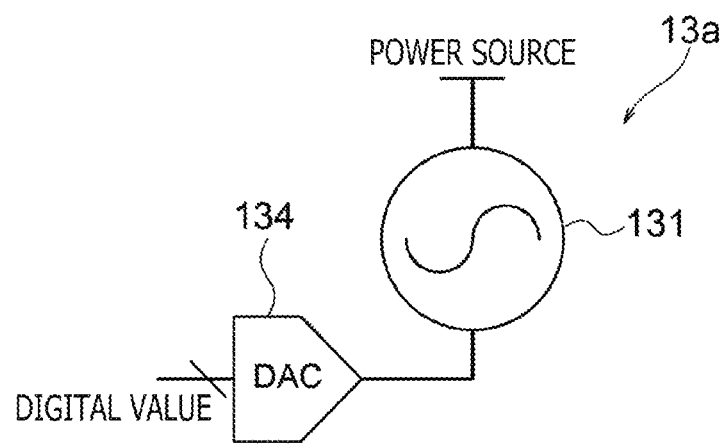
FIG. 3E is a block diagram depicting an example of a configuration of a DCO.

FIG. 3E is a block diagram depicting an example of a configuration of the DCO 13*a*. As depicted in FIG. 2, the DCO 13*a* is adopted instead of the VCO 13 in a case where a digital PLL circuit is used.

The DCO 13*a* includes the ring oscillator 131 and a D/A converter (DAC) 134. In the example depicted in FIG. 3E, the ring oscillator 131 is connected to and between the power source and the DAC 134.

Figure 3F:
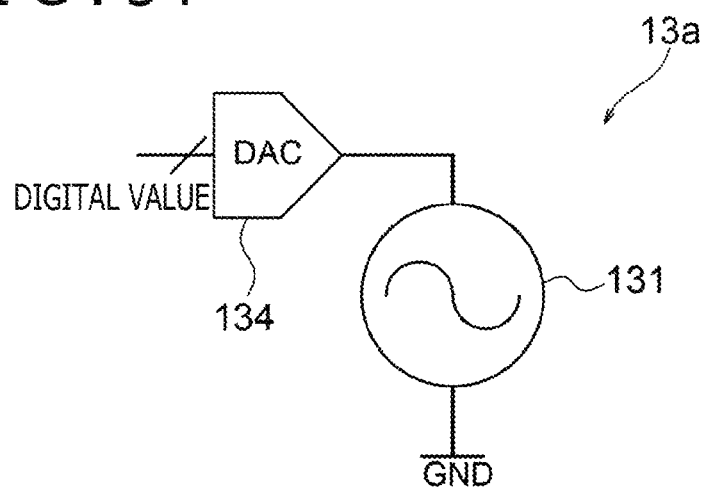
FIG. 3F is a block diagram depicting a modification of the configuration of the DCO.

FIG. 3F is a block diagram depicting a modification of the configuration of the DCO 13*a*.

In the example depicted in FIG. 3F, the ring oscillator 131 is connected to and between the DAC 134 and the ground.

For example, the ring oscillator 131 included in the VCO 13 and the ring oscillator 131 included in the DCO 13*a* have a common configuration. Note that details of the configuration of the ring oscillator 131 will be described later with reference to FIG. 5.

In addition, while the VCO 13 will hereinafter be explained, explanation of the DCO 13*a*, which is similar to the VCO 13, will be omitted.

Figure 4A:
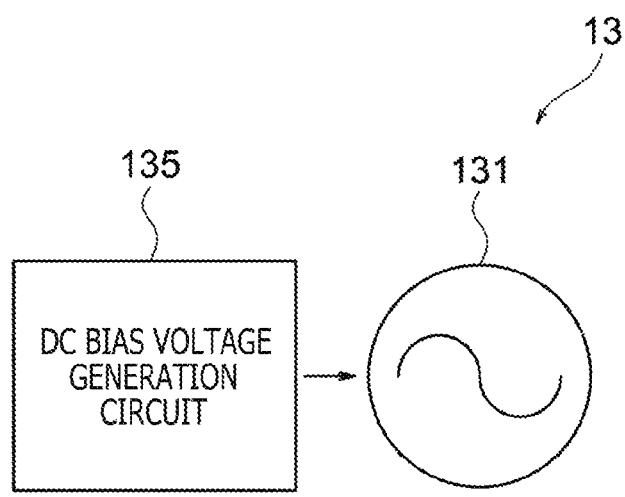
FIG. 4A is a block diagram depicting an example of a configuration of the VCO.

FIG. 4A is a block diagram depicting an example of a configuration of the VCO 13. FIG. 4A is also a diagram depicting a superordinate concept of the embodiment according to the present disclosure.

The VCO 13 further includes a DC (Direct Current) bias voltage generation circuit 135.

The DC bias voltage generation circuit 135 as a direct current control signal generation unit generates a direct current control signal corresponding to a drive capability of at least one transistor included in a delay element 1311. More specifically, the DC bias voltage generation circuit 135 generates a bias signal related to an oscillation signal of the ring oscillator 131, according to characteristics of transistors included in the ring oscillator 131. In such a manner, the DC bias voltage generation circuit 135 can apparently control the capability of the transistors included in the ring oscillator 131. For example, the DC bias voltage generation circuit 135 is provided outside the ring oscillator 131.

Figure 4B:
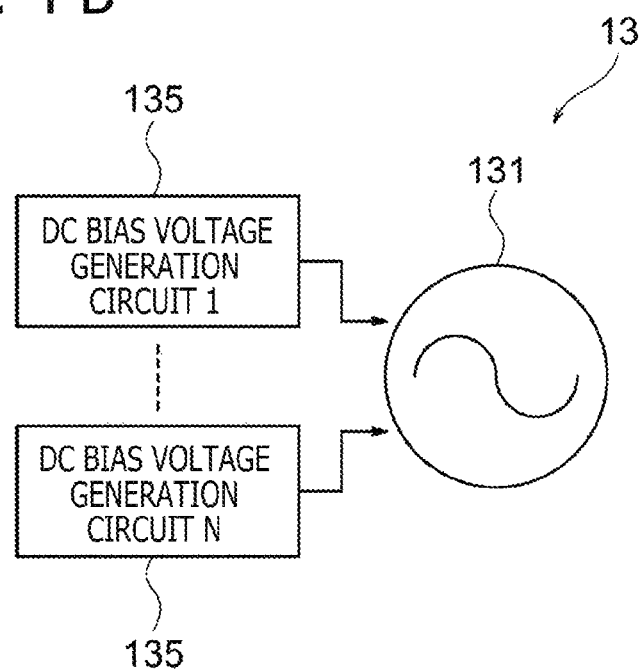
FIG. 4B is a block diagram depicting a modification of the configuration of the VCO.

FIG. 4B is a block diagram depicting a modification of the configuration of the VCO 13.

In the example depicted in FIG. 4B, N DC bias voltage generation circuits 135 are provided for one ring oscillator 131. As in this example, multiple DC bias voltage generation circuits 135 may be provided.

[Configuration Example of Ring Oscillator]

Figure 5:
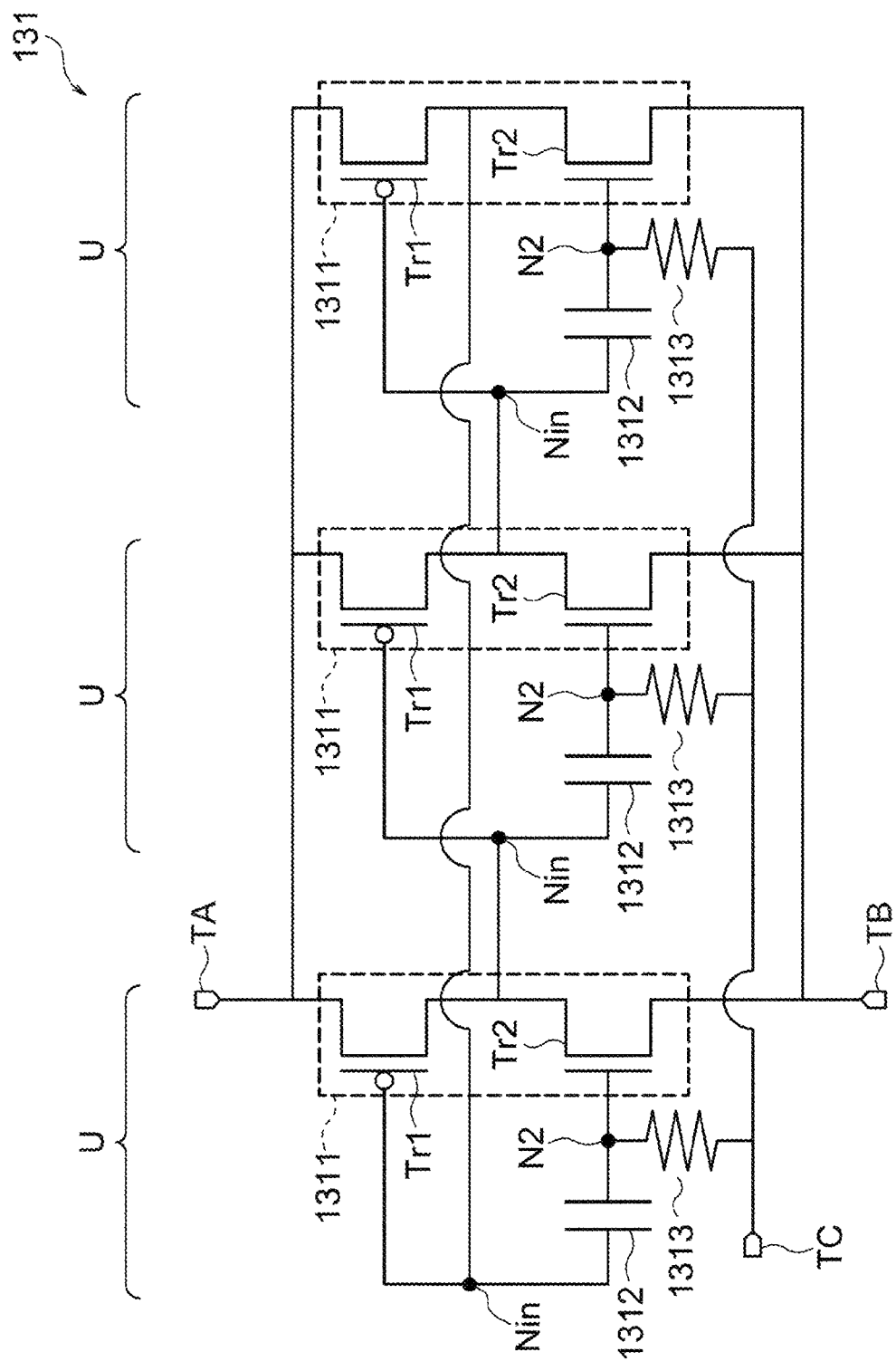
FIG. 5 is a circuit diagram depicting an example of a configuration of a ring oscillator.

FIG. 5 is a circuit diagram depicting an example of a configuration of the ring oscillator 131.

The ring oscillator 131 includes terminals TA, TB, and TC, the delay elements 1311, capacitors 1312, and resistance elements 1313. Note that each of ring units U, which constitutes one unit of the ring oscillator 131, includes the delay element 1311, the capacitor 1312, and the resistance element 1313.

The delay elements 1311 are provided in multiple stages. Each of the multiple delay elements 1311 sequentially delays an input signal, and returns at least some of the delayed signals to the preceding stage to generate an oscillation signal.

In addition, more specifically, the delay elements 1311 include multiple logical inverting circuits (inverters) connected in a ring shape. Direct current voltage levels of multiple input signals input to the multiple logical inverting circuits are collectively controlled by a direct current control signal.

Moreover, each of the logical inverting circuits has a first transistor Tr1 and a second transistor Tr2, which are transistors of conductive types different from each other and are cascode-connected between a first reference voltage node RV1 and a second reference voltage node RV2. Note that each of the logical inverting circuits is connected to the first reference voltage node RV1 and the second reference voltage node RV2 via the terminals TA and TB, respectively. Further, a direct current voltage level at a gate of either the first transistor Tr1 or the second transistor Tr2 is set by a direct current control signal. In the example depicted in FIG. 5, the first transistor Tr1 is a p-type MOS (Metal Oxide Semiconductor) transistor, while the second transistor Tr2 is an n-type MOS transistor. In this case, the logical inverting circuits are CMOS (Complementary MOS) inverters. More specifically, for example, the first transistor Tr1 and the second transistor Tr2 are a p-type MOSFET (Metal Oxide Semiconductor Field Effect Transistor) and an n-type MOSFET, respectively. In addition, an output terminal of each of the delay elements 1311 as CMOS inverters lies between the first transistor Tr1 and the second transistor Tr2.

In the example depicted in FIG. 5, connection is made between an input terminal and an output terminal of each of the delay elements 1311. Accordingly, a signal output from a certain delay element (first delay element) is input to a different delay element (second delay element). Moreover, the ring oscillator 131 which includes the three delay elements 1311 as depicted in FIG. 5 constitutes a three-stage (three-phase) ring oscillator.

Further, one end (source) of each of the first transistors Tr1 is connected to the terminal TA, while the other end (drain) is connected to one end (drain) of the corresponding second transistor Tr2. In addition, the other end (source) of each of the second transistors Tr2 is connected to the terminal TB.

For example, the terminals TA and TB are terminals for connecting the power source, the ground, the VCCS 132, the REG 133, and the DAC 134 depicted in FIGS. 3A, 3B, 3C, 3D, 3E, and 3F to the ring oscillator 131.

Figure 6:
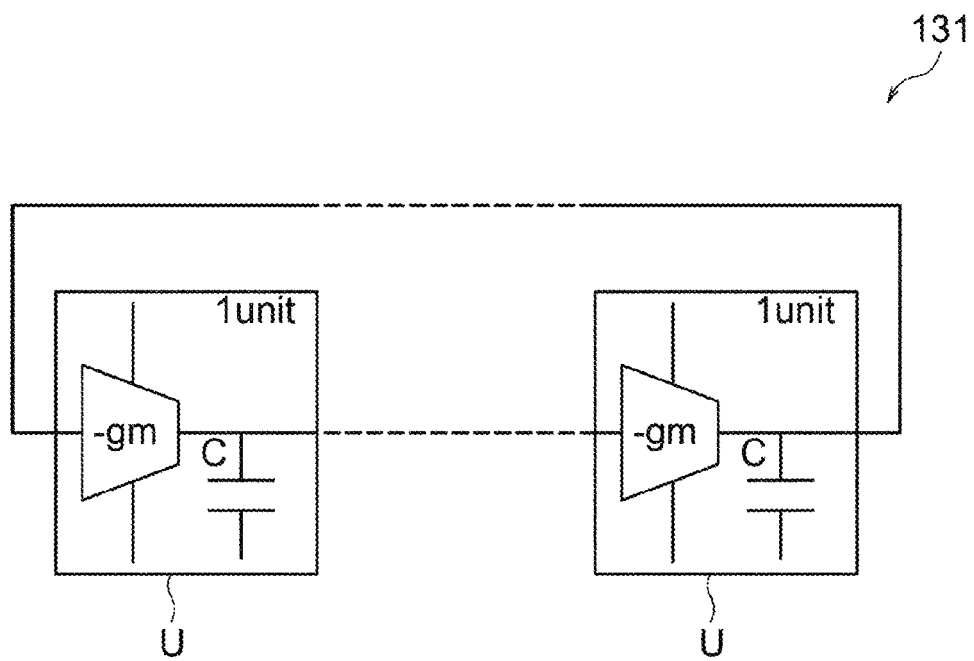
FIG. 6 is a conceptual diagram of the ring oscillator.
Figure 7:
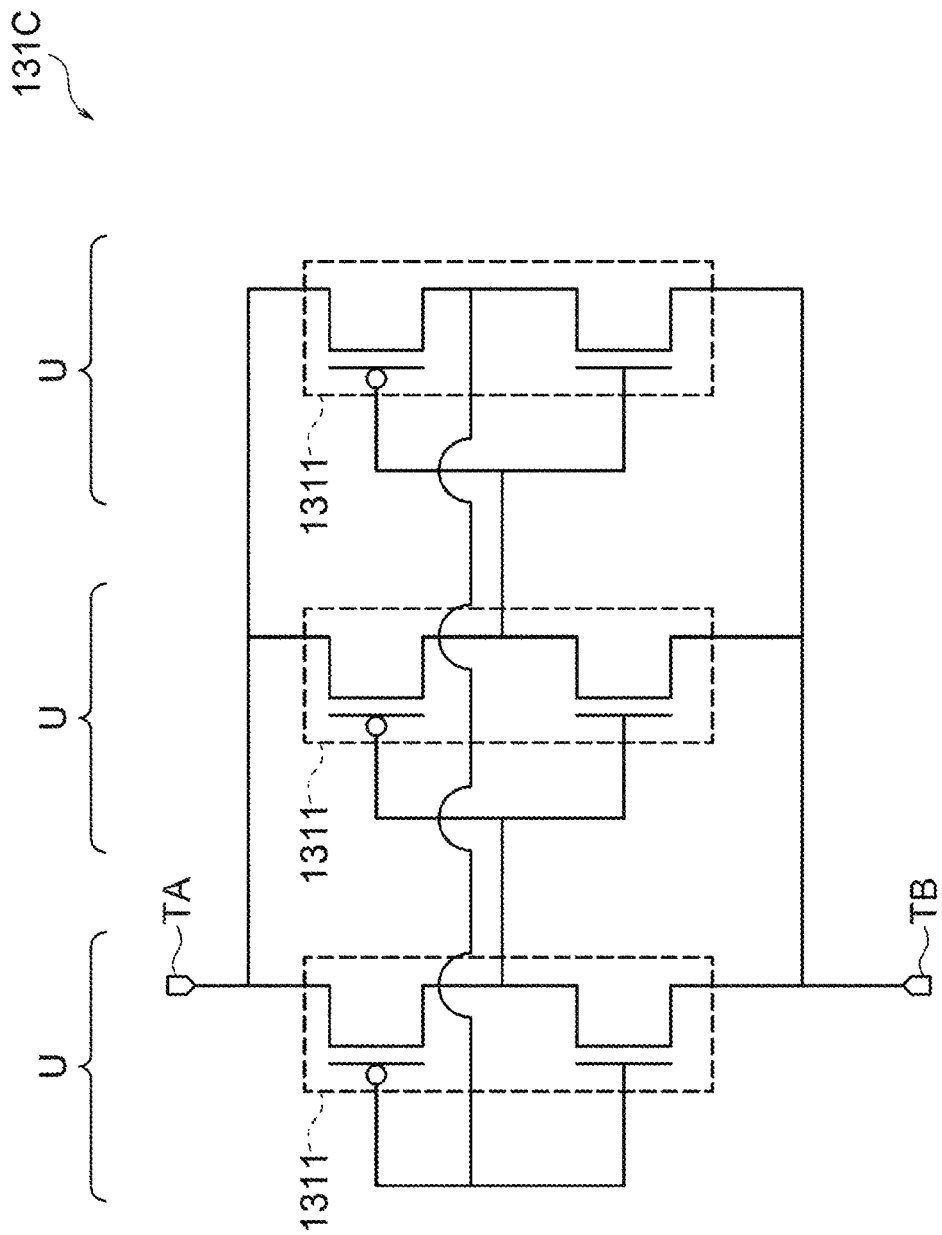
FIG. 7 is a circuit diagram depicting a configuration of a ring oscillator in a comparative example.

FIG. 6 is a conceptual diagram of the ring oscillator 131. FIG. 7 is a circuit diagram depicting a configuration of a ring oscillator 131C in a comparative example.

A simple conceptual diagram of the ring oscillator as depicted in FIG. 6 is an illustration where units (ring units U), each including an element of a current-voltage conversion gain gm and a capacitance C, are disposed in a ring shape. It is generally known that an oscillation frequency of the ring oscillator thus configured is proportional to gm/C.

The ring oscillator 131C in the comparative example depicted in FIG. 7 is one of the most basic and simplest implementation modes of the ring oscillator that can be expressed by the conceptual diagram of FIG. 6. The ring oscillator 131C depicted in FIG. 7 is a three-stage ring oscillator including the delay elements 1311 similarly to the ring oscillator 131 depicted in FIG. 5. Note that the ring oscillator 131C depicted in FIG. 7 is not equipped with the terminal TC, the capacitors 1312, and the resistance elements 1313. In the example depicted in FIG. 7, each of the delay elements 1311 is used as an element of the current-voltage conversion gain gm, while a gate capacitance in the following stage is used as the capacitance C.

However, the current-voltage conversion gain gm is considerably dependent on the capability of the transistors constituting the delay elements 1311. In addition, the transistor capability considerably varies according to processing, power source voltage, and temperature. This variation in the transistor capability according to processing, power source voltage, and temperature here is often expressed as a variation in a threshold voltage. The considerable variation in the transistor capability consequently causes a considerable characteristic variation of the ring oscillator. Note that the transistor capability corresponds to the current-voltage conversion gain gm, for example.

As such, according to the present embodiment, the transistor capability is apparently controlled by a bias voltage applied from the outside of the ring oscillator 131 via the terminal TC, to adjust oscillator characteristics as depicted in FIG. 5.

Multiple capacitors 1312 are provided. The multiple capacitors 1312 are connected to input nodes Nin of the multiple delay elements 1311 to cut off direct current signal components contained in multiple input signals. In such a manner, a direct current level of an oscillation signal can be freely shifted by a direct current bias voltage applied to the terminal TC, as will be described later.

Moreover, each of the capacitors 1312 is connected to and between the gate of the first transistor Tr1 and the gate of the second transistor Tr2 to cut off a direct current signal component contained in an output signal of any one of the other logical inverting circuits. In the example depicted in FIG. 5, one end of each of the capacitors 1312 is connected to an output terminal of the delay element 1311 in a preceding stage, while the other end is connected to a node N2. Each of the nodes N2 is connected to the gate of the corresponding second transistor Tr2.

The terminal TC as a first control terminal inputs, to the multiple delay elements 1311, a direct current control signal for collectively controlling direct current voltage levels (direct current bias levels) of multiple input signals to be input to the multiple delay elements 1311. In such a manner, the transistor capability is adjustable, and hence, the oscillator characteristics are adjustable. As a result, an oscillation frequency is controllable. In the example depicted in FIG. 5, the terminal Tc inputs the direct current control signal to the second transistors Tr2.

Moreover, in the example depicted in FIG. 5, the terminal TC is connected to the nodes N2 between the capacitors 1312 and the second transistors Tr2. The terminal TC is a terminal for connecting with the DC bias voltage generation circuit 135 depicted in FIGS. 4A and 4B. A direct current bias voltage generated by the DC bias voltage generation circuit 135 is applied to the second transistors Tr2 (ring oscillator 131) via the terminal TC.

Each of the resistance elements 1313 is connected to and between the terminal TC and the corresponding node N2.

Note that the capacitors 1312 and the resistance elements 1313 are designed such that an RC circuit (capacitance coupling) has a band of values sufficiently lower than a desired minimum oscillation frequency to secure a loop gain for an oscillator. For example, the RC circuit is so designed as to have a band of 200 MHz or lower when a minimum oscillation frequency during use is 2 GHz.

Figure 8A:
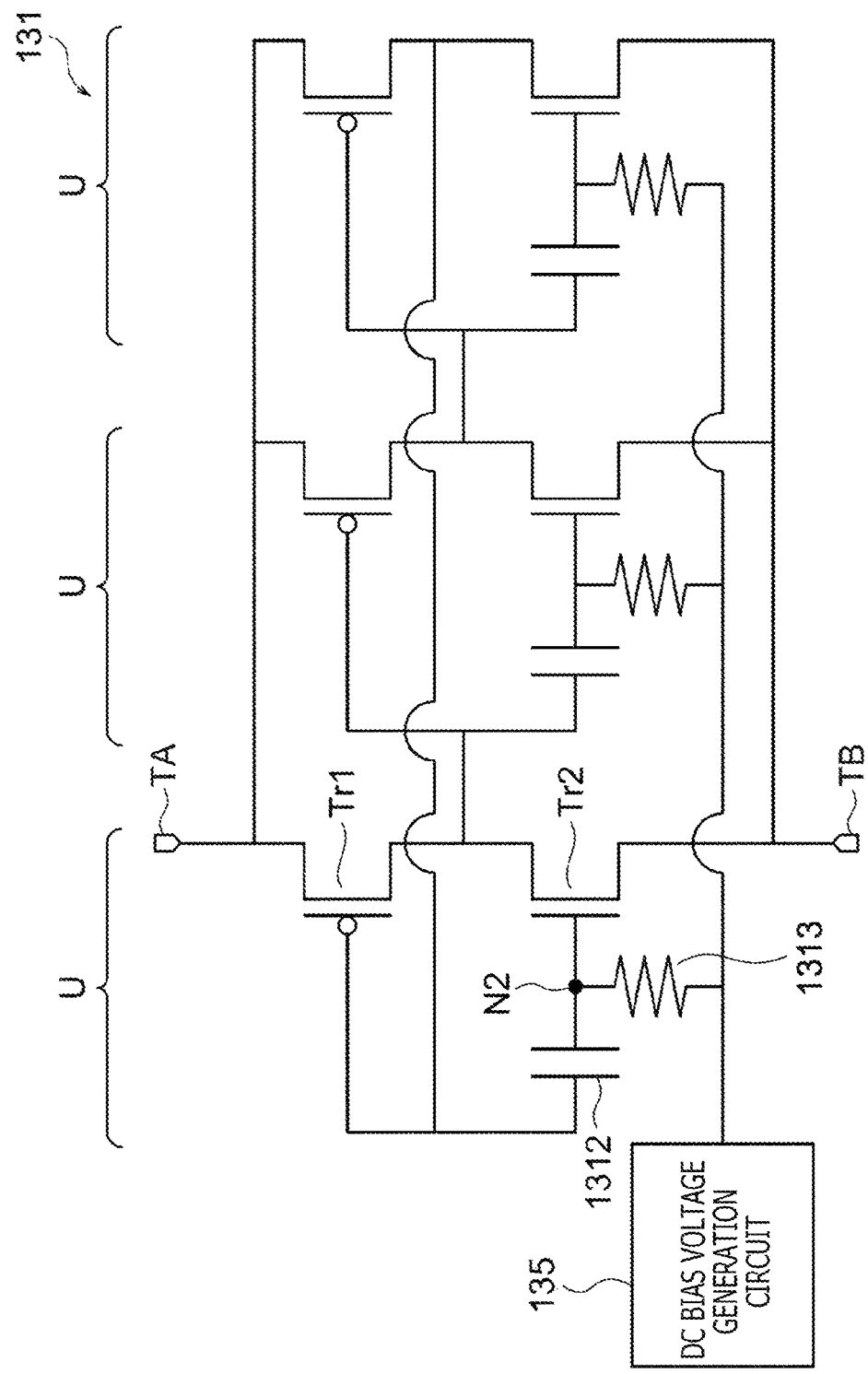
FIG. 8A is a circuit diagram depicting an example of connection between the ring oscillator and a bias voltage generation circuit.

FIG. 8A is a circuit diagram depicting an example of connection between the ring oscillator 131 and the DC bias voltage generation circuit 135. FIG. 8A depicts a connection example of FIG. 4A.

The DC bias voltage generation circuit 135 is connected to the terminal TC depicted in FIG. 5.

The oscillation frequency of the ring oscillator 131 can be increased or decreased by a direct current bias voltage supplied from the DC bias voltage generation circuit 135 being increased or decreased. Note that details of the increase or decrease of the oscillation frequency achieved by the DC bias voltage generation circuit 135 will be described later with reference to FIG. 9.

Figure 8B:
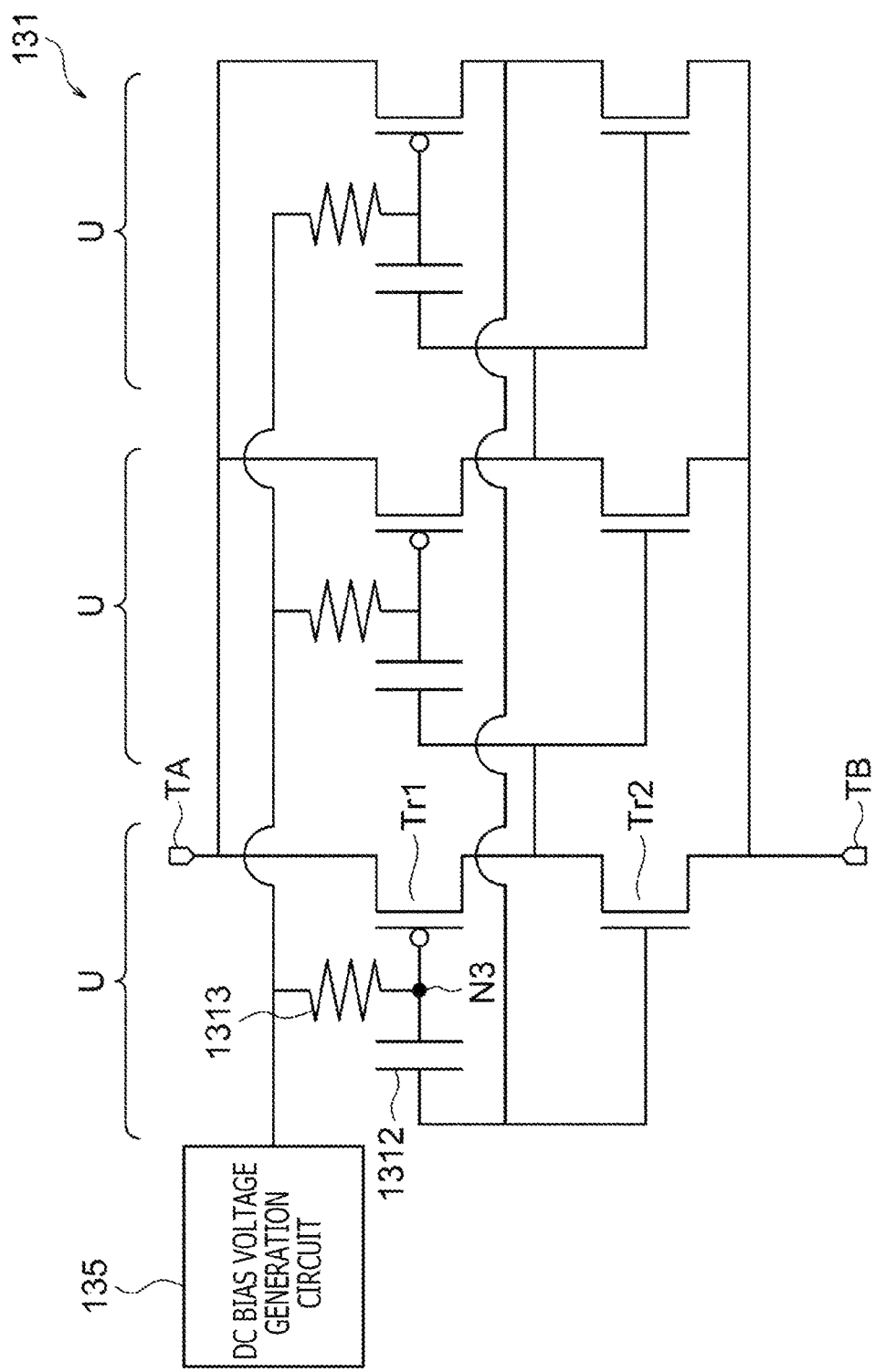
FIG. 8B is a circuit diagram depicting a modification of connection between the ring oscillator and the bias voltage generation circuit.

Each of FIGS. 8B and 8C is a circuit diagram depicting a modification example of connection between the ring oscillator 131 and the DC bias voltage generation circuit 135. FIG. 8B depicts a connection example of FIG. 4A, while FIG. 8C depicts a connection example of FIG. 4B.

In the example depicted in FIG. 8B, one end of each of the capacitors 1312 is connected to an output terminal of the delay element 1311 in a preceding stage, while the other end is connected to a node N3. The node N3 is connected to the gate of the corresponding first transistor Tr1. In addition, the DC bias voltage generation circuit 135 (terminal TC) is connected to the nodes N3. In this case, the DC bias voltage generation circuit 135 applies a direct current bias voltage to the first transistors Tr1. Moreover, each of the resistance elements 1313 is connected to and between the DC bias voltage generation circuit 135 (terminal TC) and the corresponding node N3.

The example depicted in FIG. 8C is a combination of the examples depicted in FIGS. 8A and 8B. Accordingly, the DC bias voltage generation circuit 135 applies a direct current bias voltage to both the first transistors Tr1 and the second transistors Tr2.

FIG. 9 is a diagram presenting an example of a relation between an increase or decrease of an oscillation frequency and an increase or decrease of a direct current bias voltage depicted in FIGS. 8A, 8B, and 8C.

In the examples depicted in FIGS. 8A, 8B, and 8C, the DC bias voltage generation circuit 135 (terminal TC) is connected to at least either the first transistors Tr1 or the second transistors Tr2.

The DC bias voltage generation circuit 135 adjusts a voltage level of a direct current control signal input to a gate of at least one transistor contained in the delay elements 1311 to adjust a drive capability of the transistor. More specifically, as presented in FIG. 9, the DC bias voltage generation circuit 135 generates a direct current control signal for raising a direct current voltage level of p-type MOS transistors (first transistors Tr1) or for lowering a direct current voltage level of n-type MOS transistors (second transistors Tr2) to lower the drive capability. Meanwhile, the DC bias voltage generation circuit 135 generates a direct current control signal for lowering a direct current voltage level of p-type MOS transistors (first transistors Tr1) or for raising a direct current voltage level of n-type MOS transistors (second transistors Tr2) to raise the drive capability.

In the example depicted in FIG. 8A, the DC bias voltage generation circuit 135 decreases the bias voltage of the first transistors Tr1 in a case where the ring oscillator 131 is desired to be oscillated at a lower frequency (in a case where the transistor capability is desired to be lowered). Conversely, the DC bias voltage generation circuit 135 increases the bias voltage of the second transistors Tr2 in a case where the ring oscillator 131 is desired to be oscillated at a higher frequency (in a case where the transistor capability is desired to be raised).

In the example depicted in FIG. 8B, the DC bias voltage generation circuit 135 increases the bias voltage of the first transistors Tr1 in a case where the ring oscillator 131 is desired to be oscillated at a lower frequency. Conversely, the DC bias voltage generation circuit 135 decreases the bias voltage of the first transistors Tr1 in a case where the ring oscillator 131 is desired to be oscillated at a higher frequency.

In the example depicted in FIG. 8C, the DC bias voltage generation circuit 135 is only required to increase or decrease both the bias voltages applied to the first transistors Tr1 and the second transistors Tr2, according to FIG. 9. It is more preferable that both the bias voltages be controlled in view of control of the transistor capability.

Moreover, in a case where the ring oscillator 131 is to be operated at a high frequency, the DC bias voltage generation circuit 135 may apply a power source voltage as the bias voltage. In this case, the DC bias voltage generation circuit 135 is only required to constitute wiring up to the power source.

Further, variation in oscillator characteristics produced in the case of the structure constituting the ring oscillator 131 can be reduced by application of an appropriate bias voltage according to the transistor capability. This reduction is achievable because original variation in a threshold voltage of the transistors is apparently cancellable by the threshold voltage of the transistors being apparently controlled. This variation reduction also leads to suppression of a decrease in an oscillation frequency under a condition where the transistor capability lowers (e.g., processing, power source voltage, and temperature). Consequently, as a secondary effect, the maximum oscillation frequency securable at the time of actual use of the ring oscillator 131 improves.

FIG. 10 is a diagram presenting an example of a bias voltage corresponding to the transistor capability. FIG. 10 presents a bias voltage sufficient for reducing variation in the oscillator characteristics of the ring oscillator 131 described above. More specifically, FIG. 10 is a diagram presenting an order of magnitude of the voltage value of the bias voltage according to the transistor capabilities of a p-type MOS transistor (first transistor Tr1) and an n-type MOS transistor (second transistor Tr2).

FIG. 10 presents a correlation of the drive capability degree between the first transistor Tr1 and the second transistor Tr2 prior to adjustment of the transistor capability. "Fast" of "pMOS" indicates that the first transistor Tr1 has high operation speed and high drive capability. "Slow" of "pMOS" indicates that the first transistor Tr1 has low operation speed and low drive capability. "Fast" of "nMOS" indicates that the second transistor Tr2 has high operation speed and high drive capability. "Slow" of "nMOS" indicates that the second transistor Tr2 has low operation speed and low drive capability.

As presented in FIG. 10, the DC bias voltage generation circuit 135 changes the bias voltage such that the bias voltage decreases in an order of a case of a high transistor capability of the first transistor Tr1 (p-type MOS transistor) and low transistor capability of the second transistor Tr2 (n-type MOS transistor); a case of low transistor capability of both the first transistor Tr1 and the second transistor Tr2; a case of high transistor capability of both the first transistor Tr1 and the second transistor Tr2; and a case of low transistor capability of the first transistor Tr1 and high transistor capability of the second transistor Tr2.

In the case of high transistor capability of the first transistor Tr1 (p-type MOS transistor) and low transistor capability of the second transistor Tr2 (n-type MOS transistor), the transistor capability of the first transistor Tr1 needs to be lowered, and the transistor capability of the second transistor Tr2 needs to be raised. Accordingly, the voltage value of the bias voltage is set to a maximum value, i.e., a highest value, according to the relation presented in FIG. 9.

In the case where the first transistor Tr1 and the second transistor Tr2 have an approximately equivalent transistor capability, variation in the transistor capability has already been reduced. In the case of low transistor capability of both the first transistor Tr1 and the second transistor Tr2, the voltage value of the bias voltage is set to a second highest value, according to the relation presented in FIG. 9. Meanwhile, in the case of high transistor capability of both the first transistor Tr1 and the second transistor Tr2, the voltage value of the bias voltage is set to a third highest value, according to the relation presented in FIG. 9.

In the case of low transistor capability of the first transistor Tr1 and high transistor capability of the second transistor Tr2, the transistor capability of the first transistor Tr1 needs to be raised, and the transistor capability of the second transistor Tr2 needs to be lowered. Accordingly, the voltage value of the bias voltage is set to a lowest value, i.e., a fourth highest value, according to the relation presented in FIG. 9.

Note that the order of the voltage value is not limited to the example presented in FIG. 10, and may be changed within a range where the transistor capability is appropriately adjustable.

[Configuration Example of Bias Voltage Generation Circuit]

Figure 11:
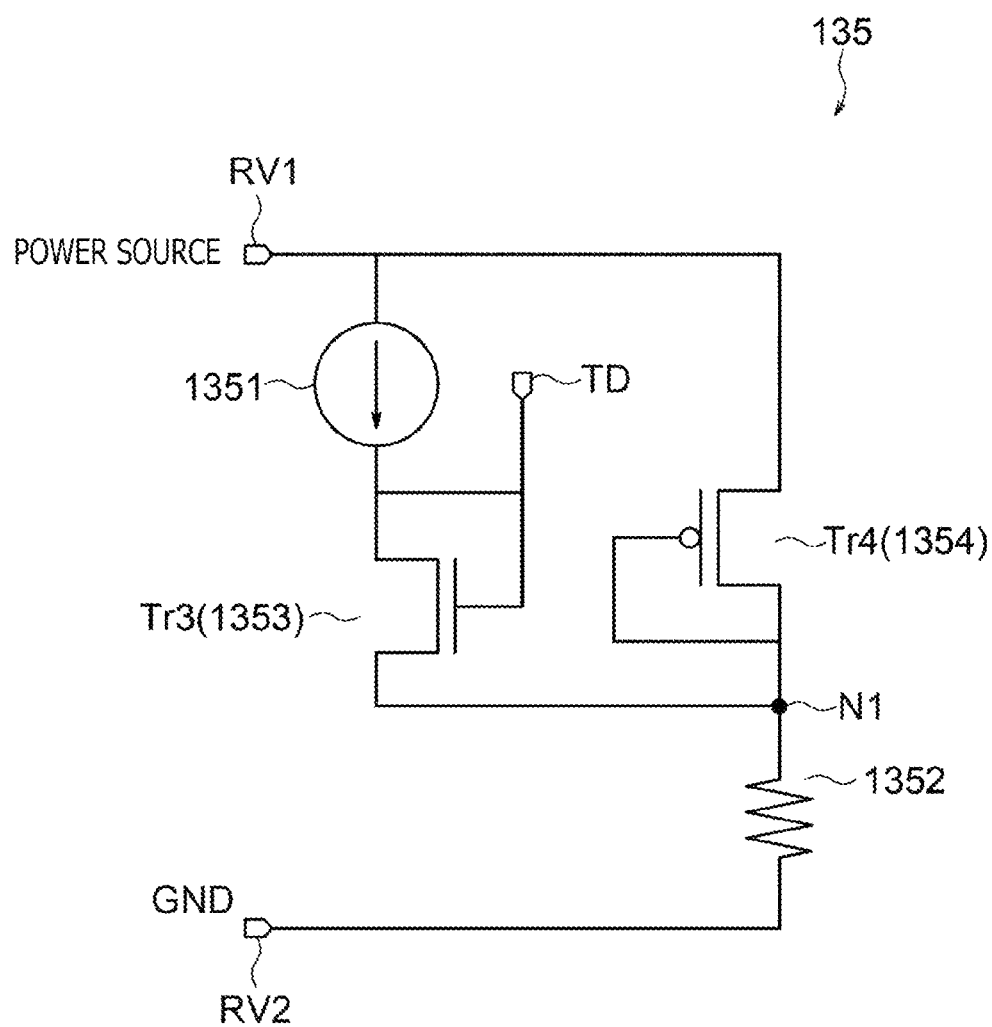
FIG. 11 is a circuit diagram depicting an example of a configuration of the bias voltage generation circuit.

FIG. 11 is a circuit diagram depicting an example of a configuration of the DC bias voltage generation circuit 135. FIG. 11 depicts an example of a circuit capable of generating the bias voltages presented in FIG. 10.

The DC bias voltage generation circuit 135 includes a current source 1351, a third transistor Tr3, a fourth transistor Tr4, a resistance element 1352, and a terminal TD. In the example depicted in FIG. 11, the third transistor Tr3 is an n-type MOS transistor 1353, while the fourth transistor Tr4 is a p-type MOS transistor 1354.

The current source 1351 is connected to and between the first reference voltage node RV1 and a first node N1. In the example depicted in FIG. 11, the first reference voltage node RV1 is a power source. Further, the current source 1351 is connected in series with the third transistor Tr3.

The third transistor Tr3 is diode-connected. Specifically, connection is made between a gate and a drain of the third transistor Tr3. More specifically, one end (drain) of the third transistor Tr3 is connected to the current source 1351 and the terminal TD, while the other end (source) is connected to the first node N1.

The fourth transistor Tr4 is connected to and between the first reference voltage node RV1 (power source) and the first node N1, and is diode-connected. Specifically, the fourth transistor Tr4 is connected in parallel with the current source 1351 and the third transistor Tr3. More specifically, one end (source) is connected to the first reference voltage node RV1, while the other end (drain) is connected to the first node N1.

The resistance element 1352 is connected to and between the first node N1 and the second reference voltage node RV2. In the example depicted in FIG. 11, the second reference voltage node RV2 is the ground.

The terminal TD as an output terminal is connected to the gate and the drain of the third transistor Tr3 to output a direct current control signal to the terminal TC. Specifically, the DC bias voltage generation circuit 135 outputs a direct current control signal from the gate and the drain of the diode-connected third transistor Tr3.

An upper voltage of the resistance element 1352 is determined by a threshold voltage of the fourth transistor Tr4. A gate voltage of the third transistor Tr3 is raised by a threshold voltage of the third transistor Tr3. Accordingly, the gate voltage (bias voltage) of the third transistor Tr3 is automatically determined by a balance between the respective threshold voltages of the third transistor Tr3 and the fourth transistor Tr4. In other words, a direct current bias voltage generated by the DC bias voltage generation circuit 135 is automatically determined by the circuit depicted in FIG. 11.

Moreover, it is preferable that each of the third transistor Tr3 and the fourth transistor Tr4 have identical or similar characteristics to those of the transistors contained in the delay elements 1311. More specifically, the n-type MOS transistor 1353 and the p-type MOS transistor 1354 are of types identical to the second transistor Tr2 and the first transistor Tr1, respectively, and have similar characteristics. For example, the phrase "identical or similar characteristics" contains not only current and voltage characteristics and the like, but also characteristic changes (drive capability changes) produced by manufacture (processing) variation, power source voltage variation, temperature variation, or the like. In such a manner, the order of the bias voltages presented in FIG. 10 can be automatically achieved according to variation in the transistor capability. Accordingly, a control signal for controlling the transistor capability need not be additionally provided.

Note that the configuration of the DC bias voltage generation circuit 135 is not limited to the example depicted in FIG. 11. The DC bias voltage generation circuit 135 may generate a bias voltage sufficient for obtaining a desired oscillation frequency in the manner presented in FIG. 9 in response to a control signal from the outside, for example.

[Logical Background for Apparent Control of Threshold Voltage by Bias Voltage]

Figure 12A:
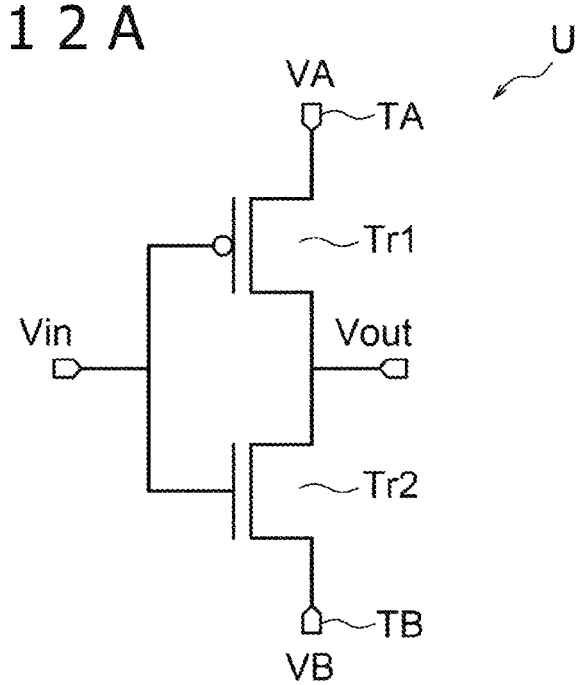
FIG. 12A is a circuit diagram depicting a comparative example of a configuration of a ring unit in the ring oscillator.
Figure 12B:
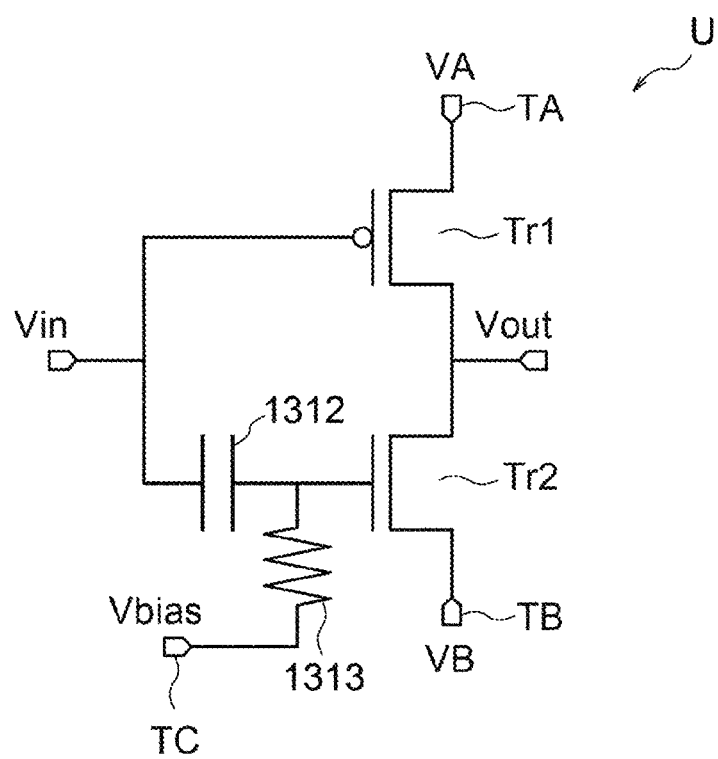
FIG. 12B is a circuit diagram depicting an example of the configuration of the ring unit in the ring oscillator.

FIG. 12A is a circuit diagram depicting a comparative example of a configuration of the ring unit U included in the ring oscillator 131C. FIG. 12B is a circuit diagram depicting an example of a configuration of the ring unit U included in the ring oscillator 131. FIGS. 12A and 12B depict the ring unit U of the ring oscillator 131C according to the comparative example in FIG. 7 and the ring unit U of the ring oscillator 131 according to the present embodiment in FIG. 5, respectively.

VA indicates a voltage at the terminal TA. VB indicates a voltage at the terminal TB. Vbias indicates a bias voltage (bias signal) supplied from the outside (terminal TC). Vin indicates an input voltage (input signal) of the delay element 1311 (ring unit U) in each stage. Vout indicates an output voltage (output signal) of the delay element 1311 in each stage.

The input voltage Vin is represented by Equation 1 which uses an alternating current input voltage Vin_AC and a direct current input voltage Vin_DC.

$$Vin = Vin\_AC + Vin\_DC \quad \text{(Equation 1)}$$

Moreover, the bias voltage Vbias is represented by Equation 2 which uses a direct current bias voltage Vbias_DC.

$$Vbias = Vbias\_DC \quad \text{(Equation 2)}$$

Note that only a direct current voltage is applied from the terminal TC as the bias voltage Vbias in the example depicted in FIG. 12B. Accordingly, the bias voltage Vbias is represented by only a direct current component.

Focus on a gate terminal of the second transistor Tr2. An overdrive voltage Vov of the second transistor Tr2 in the comparative example depicted in FIG. 7 is represented by Equation 3 on an assumption that a threshold voltage of the second transistor Tr2 is "Vth."

$$Vov = Vin\_AC + Vin\_DC - Vth \quad \text{(Equation 3)}$$

Meanwhile, an overdrive voltage Vov of the second transistor Tr2 in the present embodiment in FIG. 5 is represented by Equation 4.

$$Vov = Vin\_AC + Vbias\_DC - Vth \quad \text{(Equation 4)}$$

"Vth_shift" is here defined as expressed in Equation 5.

$$Vbias\_DC - Vin\_DC = Vth\_\text{shift} \quad \text{(Equation 5)}$$

Accordingly, Equation 4 can be rewritten into Equation 6.

$$Vov = Vin\_AC + Vin\_DC - (Vth - Vth\_\text{shift}) \quad \text{(Equation 6)}$$

According to a comparison between Equation 6 and Equation 3, "Vth" in Equation 3 is rewritten into "Vth–Vth_shift." Accordingly, the threshold voltage of the second transistor Tr2 has apparently been shifted. In such a manner, a threshold voltage of MOSFET, i.e., transistor capability, can apparently be controlled according to a difference between a direct potential of an input signal in the comparative example and a direct current bias applied from the outside (terminal TC).

As described above, the oscillation device (VCO 13) according to the present embodiment includes the terminal TC which inputs a direct current control signal for controlling direct current voltage levels of input signals to be input to the multiple delay elements 1311. In such a manner, the transistor capability can be controlled according to a bias voltage received from the outside of the ring oscillator 131, and oscillator characteristics can hence be controlled. As a result, a frequency variable width of the ring oscillator 131 can be widened (converted into a wide range). In addition, a maximum oscillation frequency securable by the ring oscillator 131 is determined by an oscillation frequency under a condition where the transistor capability is most lowered. The securable maximum oscillation frequency can be improved by apparent controlling of the transistor capability.

Moreover, the oscillation device (VCO 13) according to the present embodiment includes the DC bias voltage generation circuit 135 which generates an appropriate bias voltage corresponding to the transistor capability to reduce variation in oscillation characteristics. When the DC bias voltage generation circuit 135 has the configuration depicted in FIG. 11, for example, the transistor capability is controllable without use of a special calibration operation (function) or a special control signal.

Another known method for controlling the transistor capability is to utilize a body effect for an SOI (Silicon on Insulator) MOSFET. However, for utilizing the body effect, a specific transistor structure such as an SOIMOSFET is often required. Accordingly, manufacturing costs of a transistor having an SOIMOSFET structure is generally high in comparison with a bulk CMOS used for an SoC (System-on-a-chip).

On the other hand, according to the first embodiment, a direct current bias voltage is applied to an oscillation signal with use of a circuit structure. In such a manner, the oscillation device (VCO 13) can be manufactured by relatively inexpensive bulk CMOS processing without a specific transistor structure being required.

[Modifications]

Figure 13A:
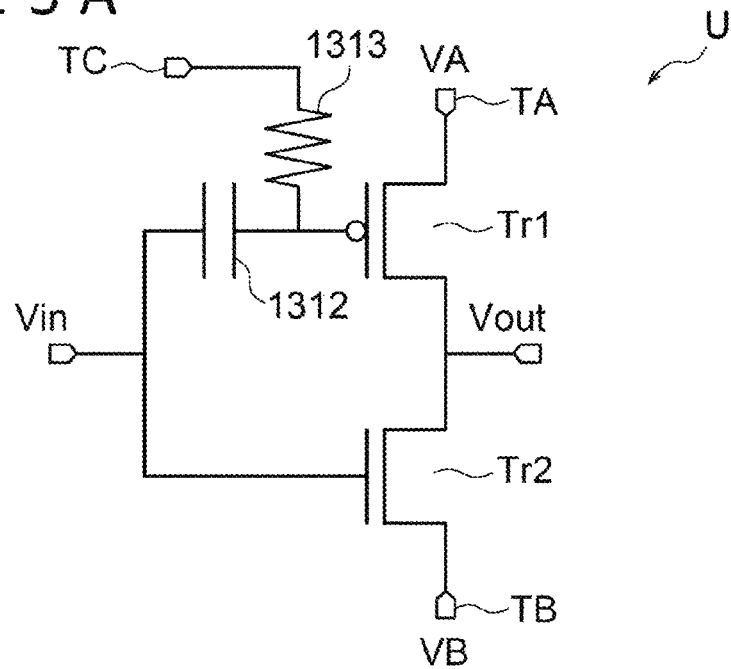
FIG. 13A is a circuit diagram depicting a modification of the configuration of the ring unit in the ring oscillator.
Figure 13B:
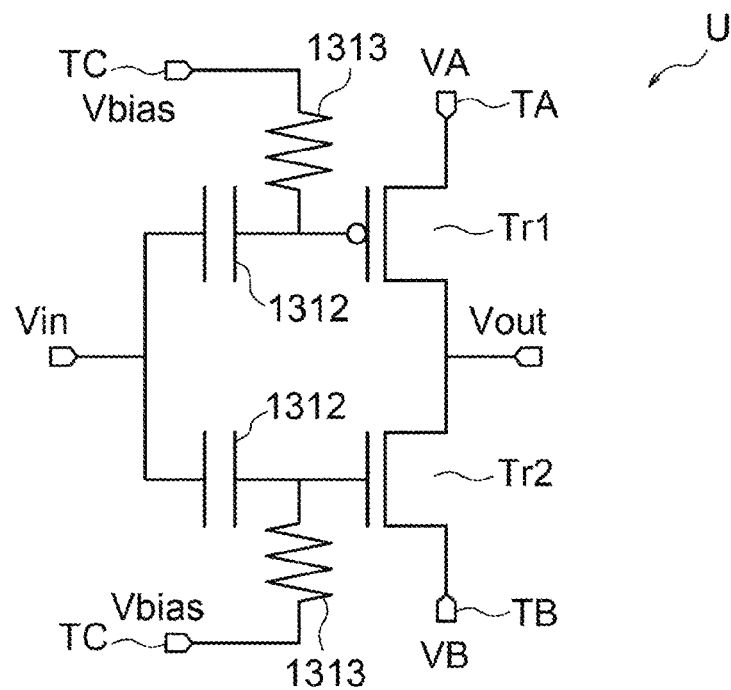
FIG. 13B is a circuit diagram depicting a modification of the configuration of the ring unit in the ring oscillator.

Each of FIGS. 13A and 13B is a circuit diagram depicting a modification of the configuration of the ring unit U of the ring oscillator 131. FIGS. 13A and 13B depict the ring unit U of the ring oscillator 131 in FIG. 8B and the ring unit U of the ring oscillator 131 in FIG. 8C, respectively.

As depicted in the figures, the terminal TC may be either connected to the gate of the first transistor Tr1 or connected to both the gates of the first transistor Tr1 and the second transistor Tr2.

Figure 14A:
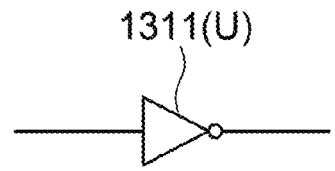
FIG. 14A is a block diagram depicting an example of the ring unit included in the ring oscillator.

FIG. 14A is a block diagram depicting an example of the ring unit U included in the ring oscillator 131. In the example depicted in FIG. 14A, the delay element 1311 is an inverter.

Figure 14B:
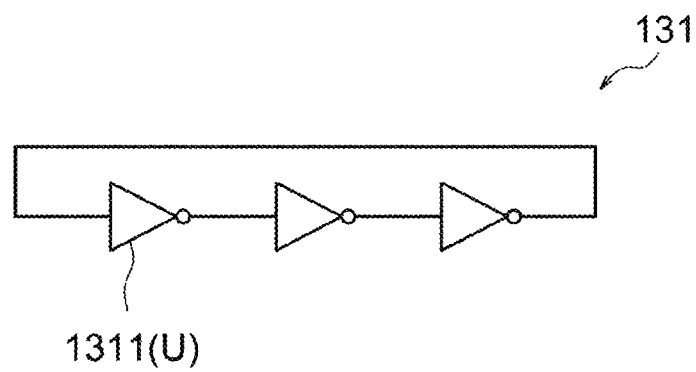
FIG. 14B is a block diagram depicting an example of a configuration of a ring oscillator including the ring units depicted in FIG. 14A.

FIG. 14B is a block diagram depicting an example of a configuration of the ring oscillator 131 including the ring units U depicted in FIG. 14A.

FIG. 14B depicts an example of the ring oscillator 131 which oscillates in odd phases. The ring oscillator 131 depicted in FIG. 14B is a three-stage inverter chain similar to the ring oscillator 131 depicted in FIG. 5. However, the ring oscillator 131 is not limited to this example, and may be a five-stage, seven-stage, or other-stage inverter chain.

Figure 14C:
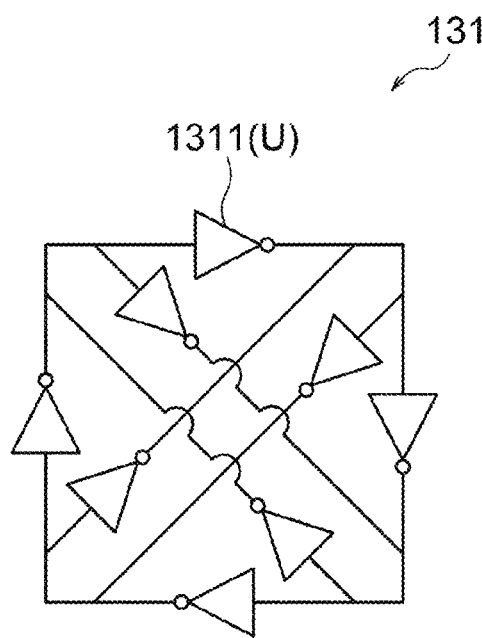
FIG. 14C is a block diagram depicting a modification of the configuration of the ring oscillator including the ring units depicted in FIG. 14A.

FIG. 14C is a block diagram depicting a modification of the configuration of the ring oscillator 131 including the ring units U depicted in FIG. 14A.

FIG. 14C depicts an example of the ring oscillator 131 which oscillates in even phases. As depicted in the figure, the number of the stages of the connected delay elements 1311 is not limited to an odd number.

Figure 15A:
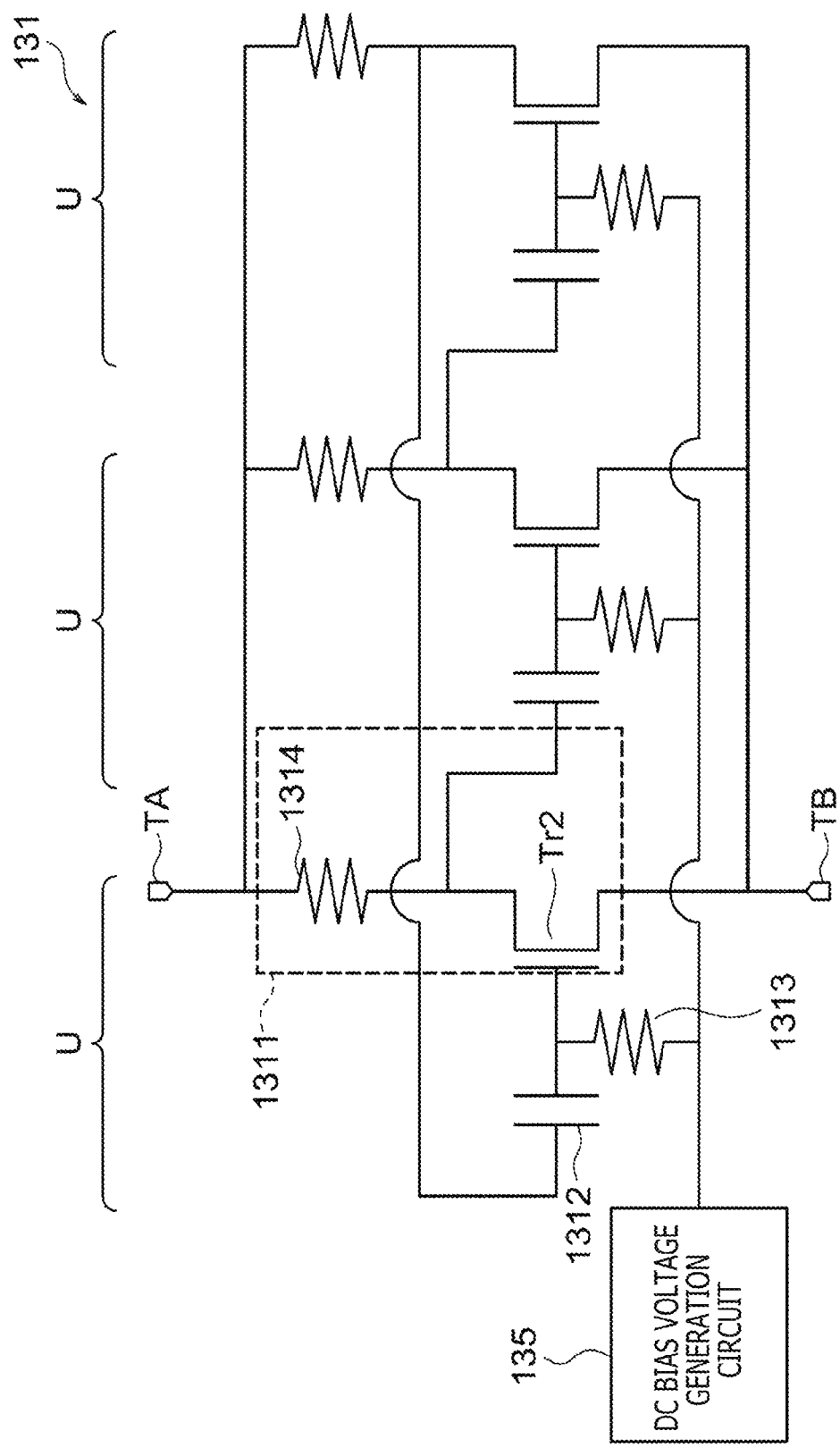
FIG. 15A is a circuit diagram depicting a modification of the configuration of the ring oscillator.
Figure 15B:
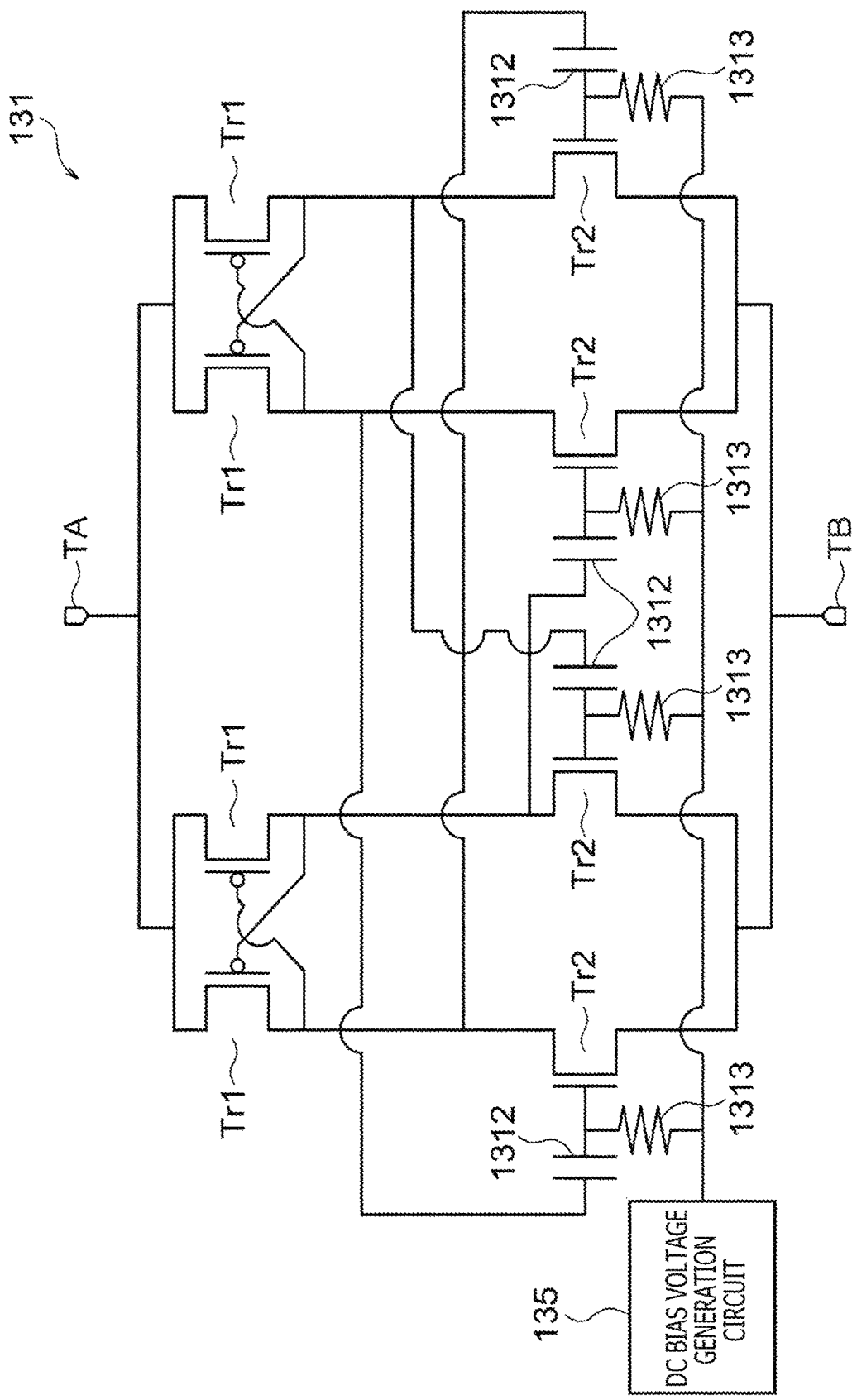
FIG. 15B is a circuit diagram depicting a modification of the configuration of the ring oscillator.

Each of FIGS. 15A and 15B is a circuit diagram depicting a modification of the configuration of the ring oscillator 131.

In the example depicted in FIG. 15A, resistance elements 1314 are provided as load resistances in place of the first transistors Tr1. In this case, the delay elements 1311 similarly function as inverters.

In the example depicted in FIG. 15B, a differential amplifier circuit is employed as the delay elements 1311.

As described above, the delay elements 1311 are not limited to elements constituting an inverter chain of CMOS inverters. Accordingly, the delay elements 1311 are only required to include transistors each having a gate at which a direct current voltage level is adjusted according to a direct current control signal.

Figure 16:
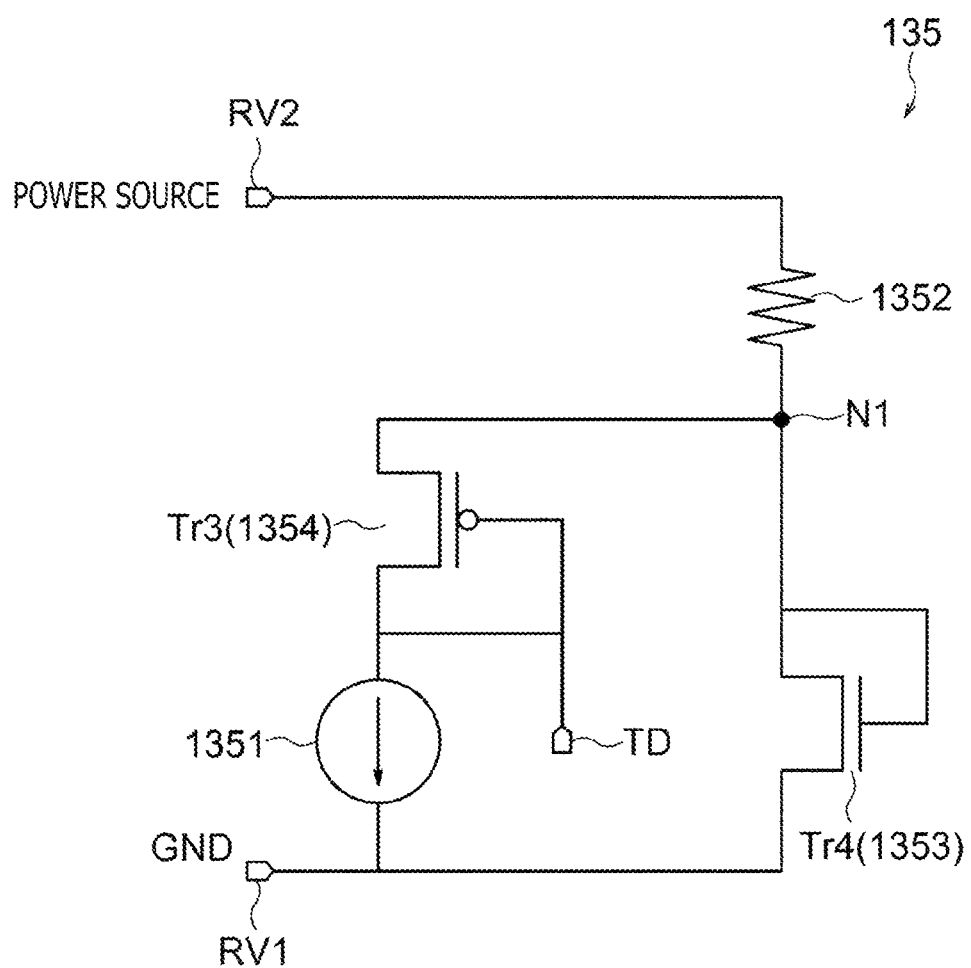
FIG. 16 is a circuit diagram depicting a modification of the configuration of the bias voltage generation circuit.

FIG. 16 is a circuit diagram depicting a modification of the configuration of the DC bias voltage generation circuit 135.

In the example depicted in FIG. 16, the third transistor Tr3 is the p-type MOS transistor 1354, while the fourth transistor Tr4 is the n-type MOS transistor 1353. Moreover, the first reference voltage node RV1 is the ground, while the second reference voltage node RV2 is the power source. Other configurations of the DC bias voltage generation circuit 135 depicted in FIG. 16 are similar to the corresponding configurations of the DC bias voltage generation circuit 135 depicted in FIG. 11.

The DC bias voltage generation circuit 135 depicted in FIG. 16 has a function and a role substantially similar to those of the DC bias voltage generation circuit 135 depicted in FIG. 11, but is different in an outputtable voltage range, a transfer function from a power source voltage, and the like. In a case where a DC bias voltage is supplied to the second transistors Tr2 in FIGS. 8A and 8C, it is preferable that the DC bias voltage generation circuit 135 depicted in FIG. 11 supply a bias voltage. On the other hand, in a case where a bias voltage is supplied to the first transistors Tr1 in FIGS. 8B and 8C, it is preferable that the DC bias voltage generation circuit 135 depicted in FIG. 16 supply a bias voltage. In such a manner, the ring oscillator 131 is operable at oscillation frequencies in a wider range.

Figure 17A:
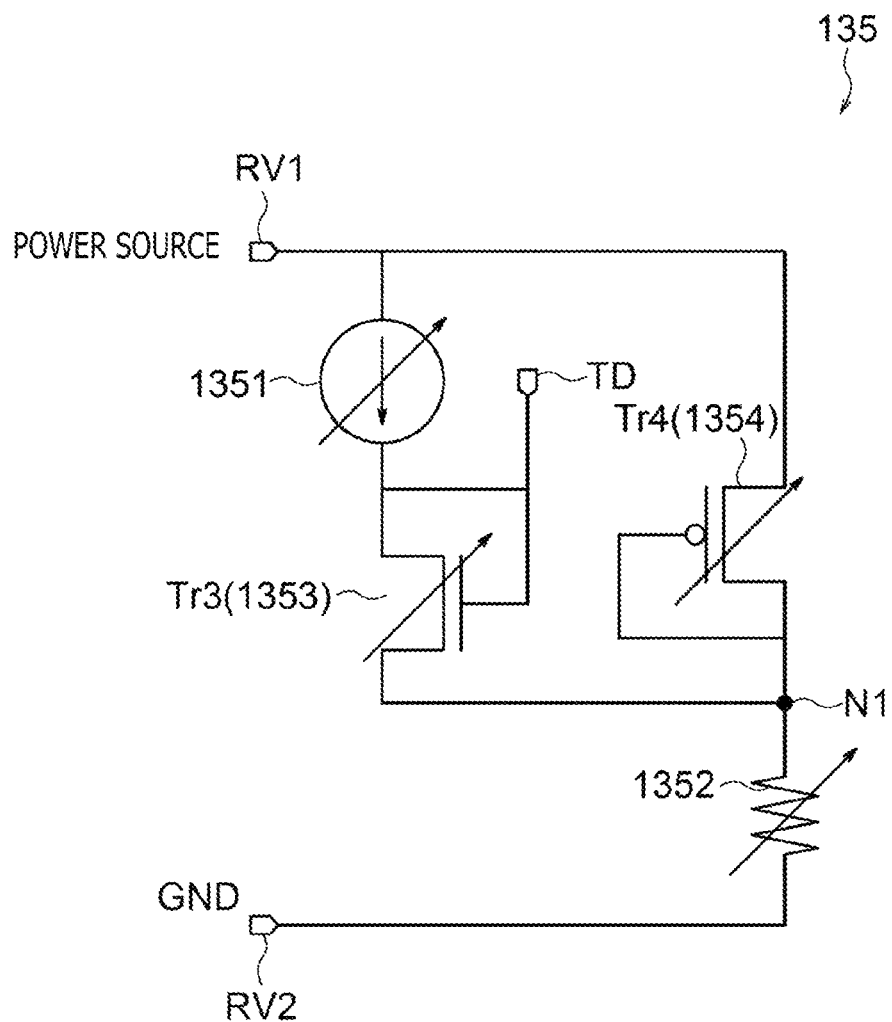
FIG. 17A is a circuit diagram depicting a modification of the configuration of the bias voltage generation circuit.
Figure 17B:
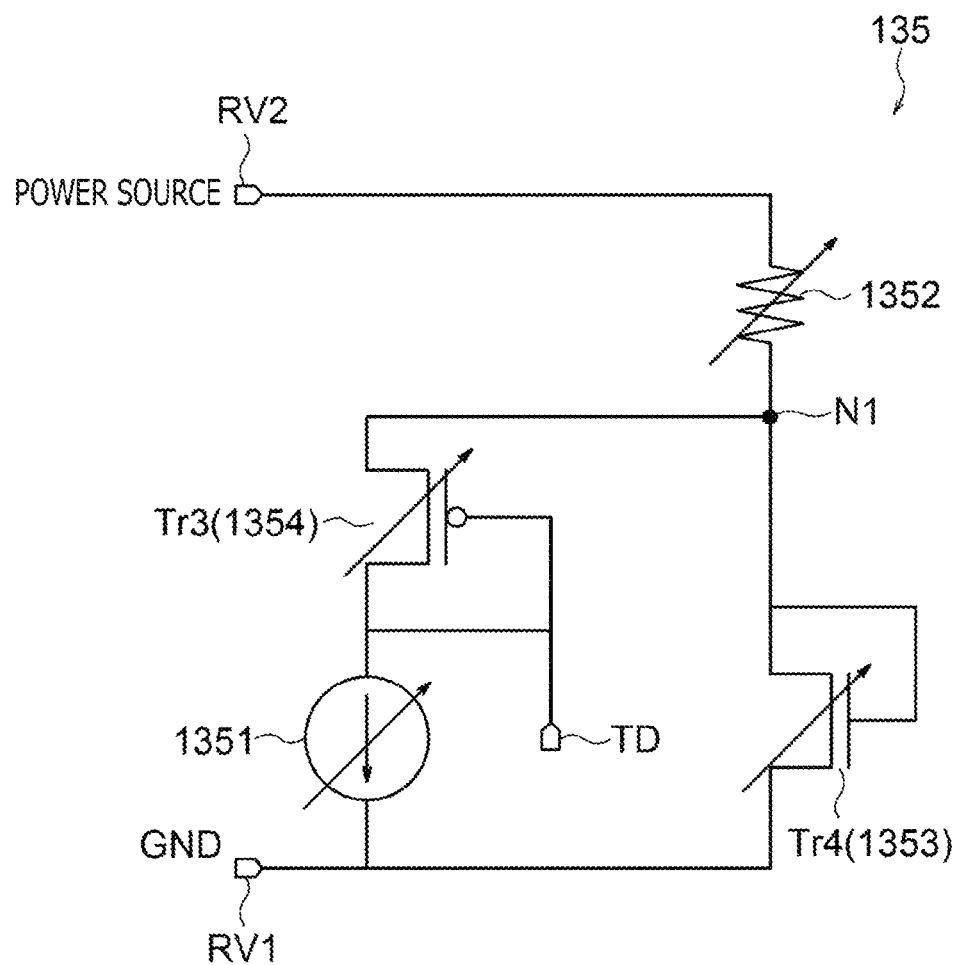
FIG. 17B is a circuit diagram depicting a modification of the configuration of the bias voltage generation circuit.

Each of FIGS. 17A and 17B is a circuit diagram depicting a modification of the configuration of the DC bias voltage generation circuit 135.

The DC bias voltage generation circuit 135 controls a direct current voltage level of a direct current control signal by changing at least one of a current flowing in the current source 1351, the parallel number of the third transistor Tr3, the parallel number of the fourth transistor Tr4, and the resistance of the resistance element 1352. The change of the parallel number of the transistor is an example of a method for controlling an amount of a current flowing in the transistor by changing the transistor size. Moreover, a variable mechanism is controlled according to a control signal input from the outside of the VCO 13, for example.

The DC bias voltage generation circuits 135 depicted in FIGS. 17A and 17B each include variable mechanisms for the current source 1351, the third transistor Tr3, the fourth transistor Tr4, and the resistance element 1352 contained in each of the DC bias voltage generation circuits 135 depicted in FIGS. 11 and 16.

Such variable mechanisms achieve not only automatic adjustment of the characteristics of the ring oscillator 131 according to the transistor capability, but also control for providing a more appropriate transistor capability for each oscillation frequency, for example.

FIG. 18 is a diagram presenting an example of a relation between operations of the variable mechanisms depicted in FIGS. 17A and 17B and a bias voltage. "Embodiment (a)" in FIG. 18 indicates operations of the variable mechanisms included in the DC bias voltage generation circuit 135 in FIG. 17A. "Embodiment (b)" in FIG. 18 indicates operations of the variable mechanisms included in the DC bias voltage generation circuit 135 in FIG. 17B.

In the case of the example depicted in FIG. 17A, the third transistor Tr3 is the n-type MOS transistor 1353, and the fourth transistor Tr4 is the p-type MOS transistor 1354. In this case, the DC bias voltage generation circuit 135 lowers the direct current voltage level by decreasing the current flowing in the current source 1351, or raises the direct current voltage level by increasing the current flowing in the current source 1351. Similarly, the DC bias voltage generation circuit 135 lowers the direct current voltage level by increasing the parallel number of the n-type MOS transistor 1353 and decreasing the parallel number of the p-type MOS transistor 1354, or raises the direct current voltage level by decreasing the parallel number of the n-type MOS transistor 1353 and increasing the parallel number of the p-type MOS transistor 1354. Similarly, the DC bias voltage generation circuit 135 lowers the direct current voltage level by decreasing the resistance value of the resistance element 1352, or raises the direct current voltage level by increasing the resistance value of the resistance element 1352.

In the case of the example depicted in the example of FIG. 17B, the third transistor Tr3 is the p-type MOS transistor 1354, and the fourth transistor Tr4 is the n-type MOS transistor 1353. In this case, the DC bias voltage generation circuit 135 lowers the direct current voltage level by increasing the current flowing in the current source 1351, or raises the direct current voltage level by decreasing the current flowing in the current source 1351. Similarly, the DC bias voltage generation circuit 135 raises the direct current voltage level by decreasing the parallel number of the n-type MOS transistor 1353 and increasing the parallel number of the p-type MOS transistor 1354, or lowers the direct current voltage level by increasing the parallel number of the n-type MOS transistor 1353 and decreasing the parallel number of the p-type MOS transistor 1354. Similarly, the DC bias voltage generation circuit 135 lowers the direct current voltage level by increasing the resistance value of the resistance element 1352, or raises the direct current voltage level by decreasing the resistance value of the resistance element 1352.

Moreover, as presented in FIG. 18, the increase or decrease of the parallel number of the n-type MOS transistors 1353 and the increase or decrease of the parallel number of the p-type MOS transistors 1354 have an opposite relation.

Note that specific settings of an oscillation frequency with use of the variable mechanisms will be described later with reference to FIGS. 22A, 22B, and 22C.

Figure 19A:
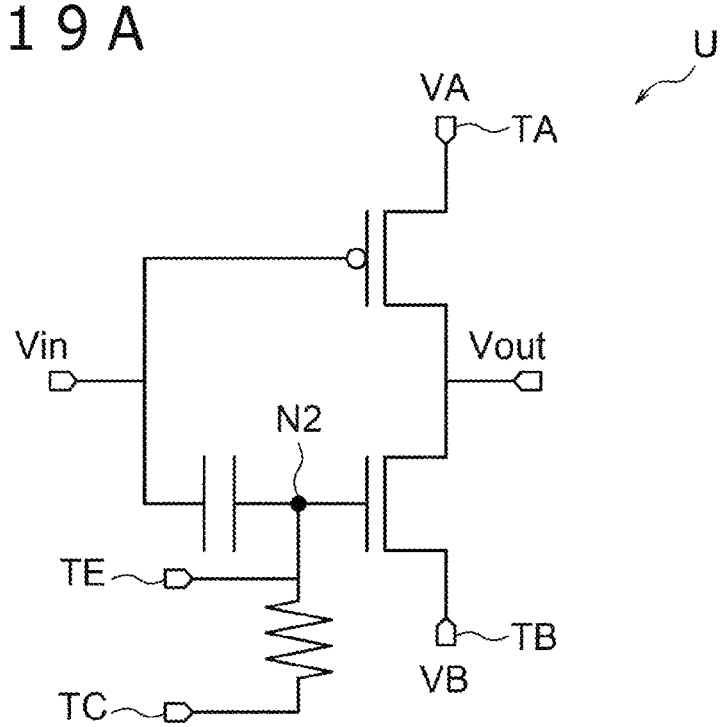
FIG. 19A is a circuit diagram depicting a modification of the configuration of the ring unit.
Figure 19B:
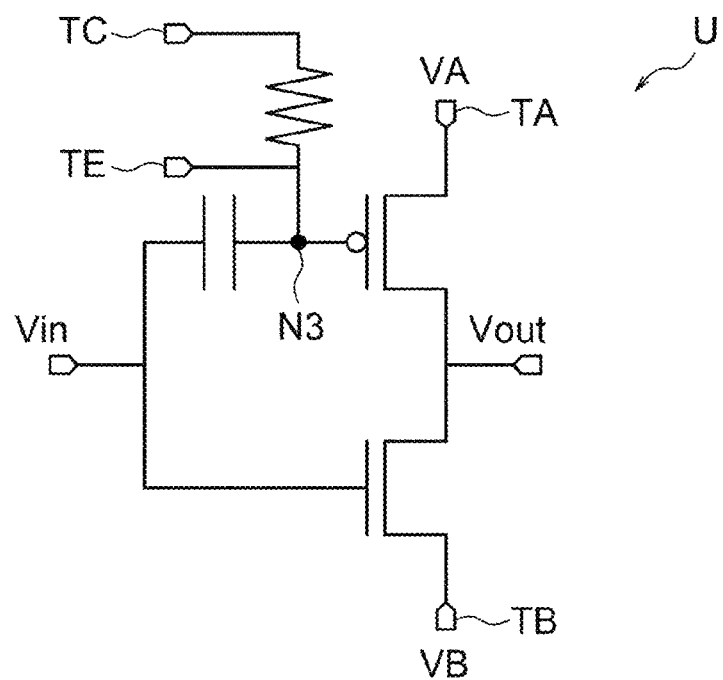
FIG. 19B is a circuit diagram depicting a modification of the configuration of the ring unit.
Figure 19C:
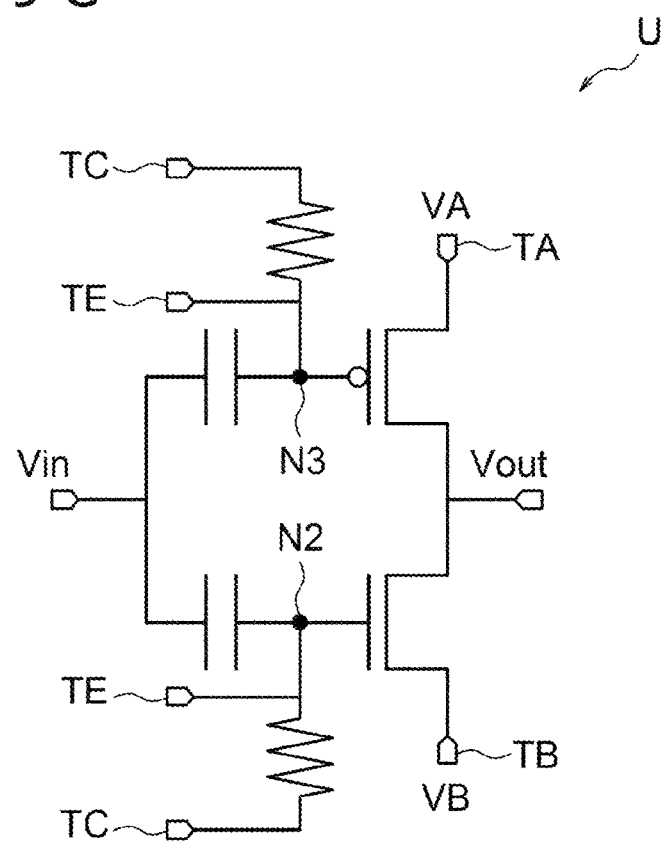
FIG. 19C is a circuit diagram depicting a modification of the configuration of the ring unit.

Each of FIGS. 19A, 19B, and 19C is a circuit diagram depicting a modification of the configuration of the ring unit U.

The ring oscillator 131 further includes a terminal TE. In the examples depicted in FIGS. 19A, 19B, and 19C, the terminal TE is further provided in each of the ring units U depicted in FIGS. 12B, 13A, and 13B.

The terminal TE as a second control terminal inputs an alternating current control signal for controlling alternating current voltage levels of input signals to be input to the multiple delay elements 1311. The terminal TE is connected to at least either the node N2 or the node N3.

Figure 20A:
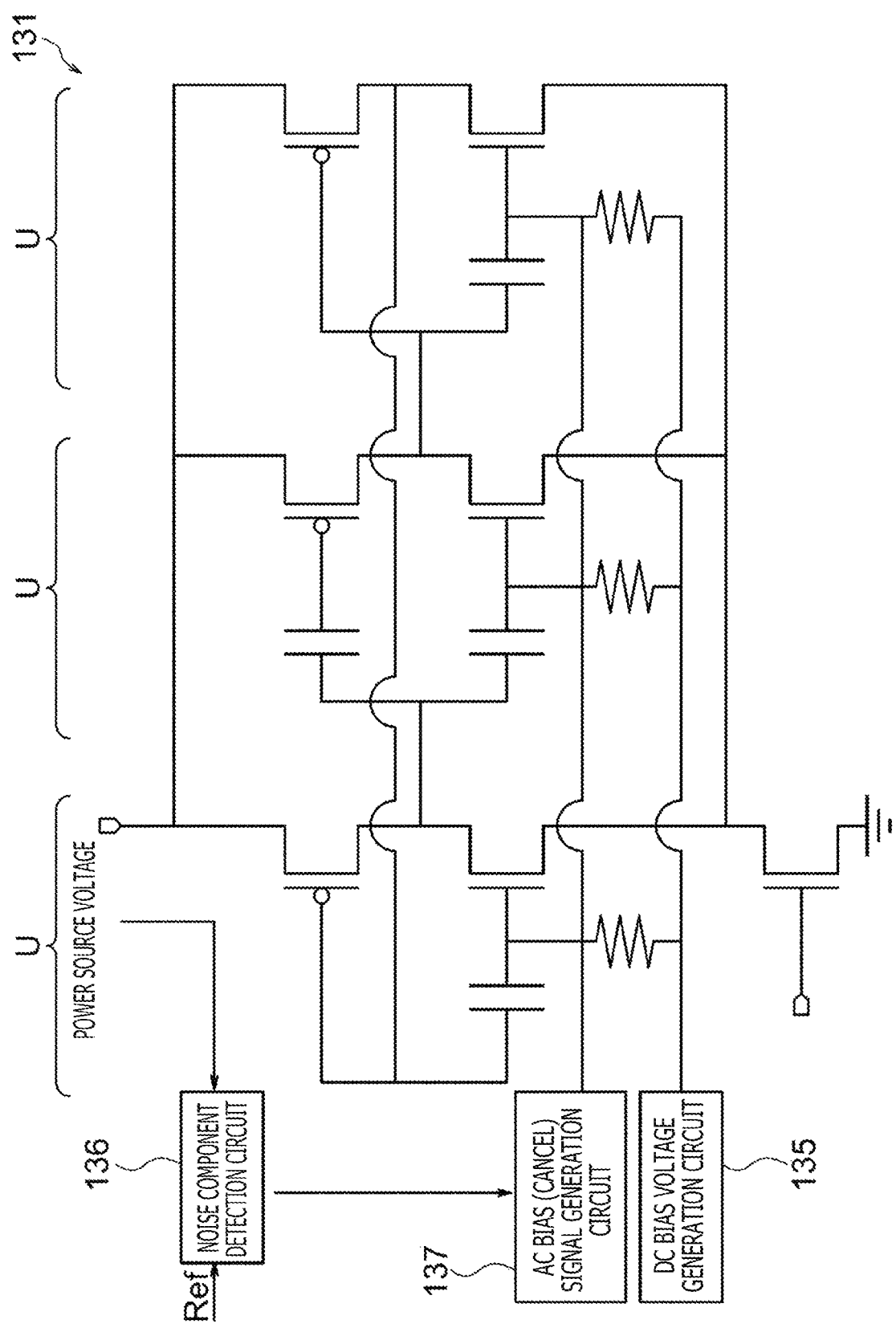
FIG. 20A is a circuit diagram depicting a modification of the configuration of the ring oscillator.

FIG. 20A is a circuit diagram depicting a modification of the configuration of the ring oscillator 131. The ring oscillator 131 depicted in FIG. 20A includes the ring units U depicted in FIG. 19A, for example. Moreover, FIG. 20A is also a diagram for explaining a use example of an AC bias voltage.

The VCO 13 further includes a noise component detection circuit 136 and an AC (Alternating Current) bias signal generation circuit 137.

The noise component detection circuit 136 as a noise component detection unit detects a noise component of a power source voltage supplied to the multiple delay elements 1311.

The AC bias signal generation circuit 137 provided as an alternating current control signal generation unit generates an alternating current control signal as a signal for cancelling the noise component.

In the example depicted in FIG. 20A, the noise component detection circuit 136 detects a noise component superimposed on the power source voltage. The AC bias signal generation circuit 137 generates an AC bias voltage having inverse characteristics according to the magnitude of the noise component, and applies the generated AC bias voltage to the ring oscillator 131 in a feedforward manner. In other words, the AC bias signal generation circuit 137 supplies the AC bias voltage to the ring oscillator 131 to cancel an effect of noise of the power source voltage. In this manner, reduction of a characteristic change of the ring oscillator 131 caused by fluctuation of the power source voltage is achievable.

Figure 20B:
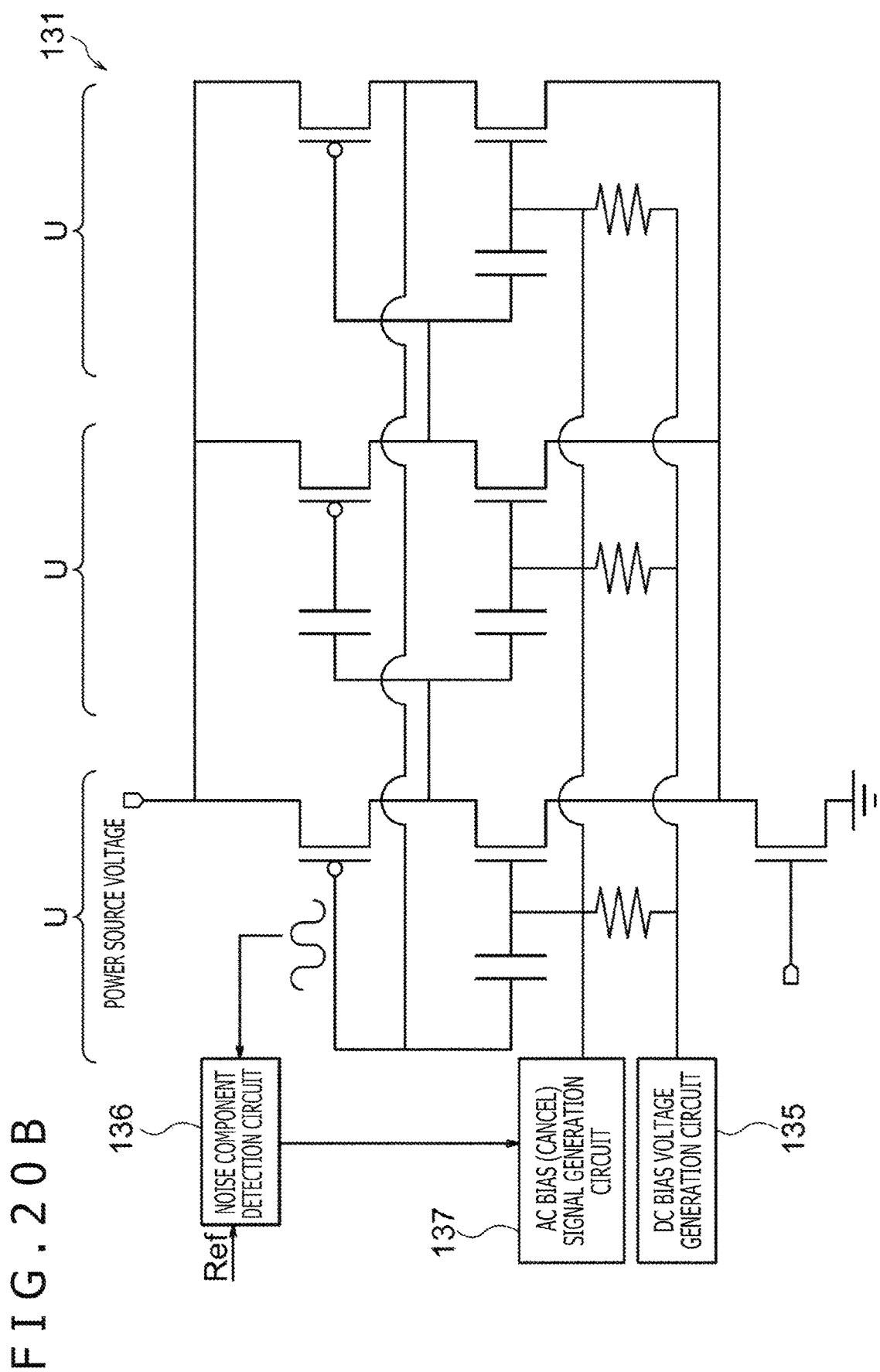
FIG. 20B is a circuit diagram depicting a modification of the configuration of the ring oscillator.

FIG. 20B is a circuit diagram depicting a modification of the configuration of the ring oscillator 131. The modification depicted in FIG. 20B is different from the modification depicted in FIG. 20A in a point that a detection target of the noise component detection circuit 136 is an oscillation signal of the ring oscillator 131.

The noise component detection circuit 136 detects a noise component of an oscillation signal output from the delay elements 1311.

In the example depicted in FIG. 20B, the noise component detection circuit 136 detects noise superimposed on the oscillation signal. The AC bias signal generation circuit 137 generates an AC bias voltage having an inverse phase according to magnitude of a noise component, and applies the generated AC bias voltage to the ring oscillator 131 in a feedback manner. In other words, the AC bias signal generation circuit 137 supplies the AC bias voltage to the ring oscillator 131 to cancel an effect of noise of the oscillation signal.

Note that the noise component detection circuit 136 may detect the noise components of both the power source voltage and the oscillation signal.

Embodiment of VCO

Figure 21:
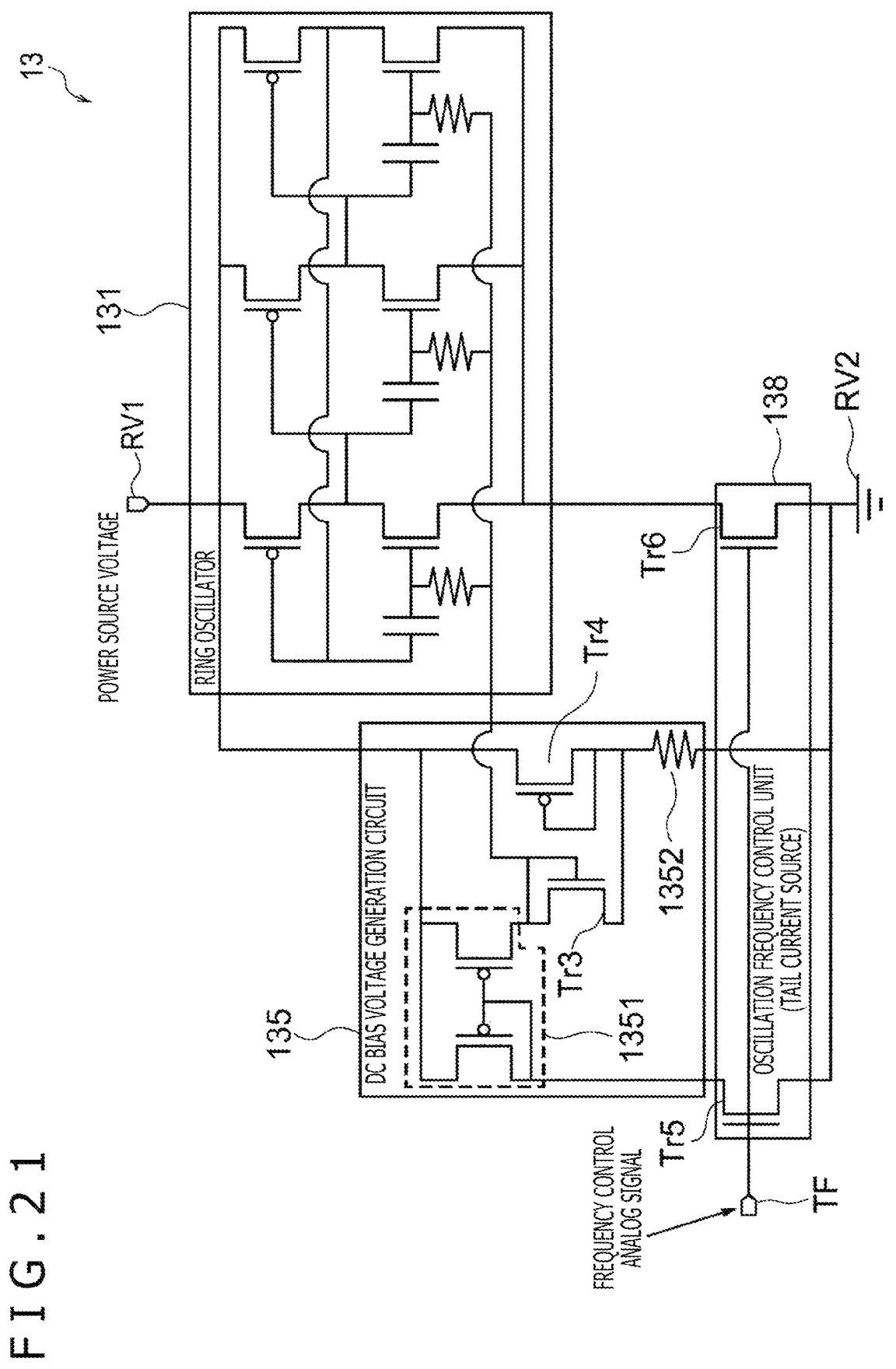

FIG. 21 is a circuit diagram depicting an example of a configuration of the VCO 13. FIG. 21 depicts a combination of the connection example in FIG. 8A and the DC bias voltage generation circuit 135 which varies a current value of the current source 1351 in FIG. 17A.

The multiple delay elements 1311 are connected to and between the first reference voltage node RV1 and the second reference voltage node RV2. Accordingly, the ring oscillator 131 is connected in parallel with the DC bias voltage generation circuit 135. In the example depicted in FIG. 21, the first reference voltage node RV1 is the power source, while the second reference voltage node RV2 is the ground.

The VCO 13 further includes an oscillation frequency control unit 138.

The oscillation frequency control unit 138 controls an oscillation frequency of an oscillation signal. In the example depicted in FIG. 21, the oscillation frequency control unit 138 is the VCCS 132 depicted in FIG. 3A. Accordingly, FIG. 21 is also a figure incorporating FIG. 3A. Further, the oscillation frequency control unit 138 includes a fifth transistor Tr5, a sixth transistor Tr6, and a terminal TF.

The fifth transistor Tr5 controls a current flowing in the current source 1351. In the example depicted in FIG. 21, the fifth transistor Tr5 is connected to and between the current source 1351 and the second reference voltage node RV2.

The sixth transistor Tr6 applies a drain current proportional to a drain current of the fifth transistor Tr5. A delay time of each of the multiple delay elements 1311 varies according to the drain current of the sixth transistor Tr6. The sixth transistor Tr6 is provided between the multiple delay elements 1311 and the first reference voltage node RV1 or the second reference voltage node RV2. In the example depicted in FIG. 21, the sixth transistor Tr6 is connected to and between the ring oscillator 131 and the second reference voltage node RV2. Further, the sixth transistor Tr6 applies a current to the multiple delay elements 1311. The ring oscillator 131 operates at a higher frequency as the value of the current flowing in the sixth transistor Tr6 increases.

The oscillation frequency control unit 138 controls the current flowing in the current source 1351 by controlling a gate voltage of the fifth transistor Tr5, and controls the oscillation frequency of the oscillation signal by controlling the delay time of each of the multiple delay elements 1311.

In addition, more specifically, the current flowing in the current source 1351 and the drain current in the sixth transistor Tr6 are controlled by the gate voltage of the fifth transistor Tr5 being controlled. This control is achievable because a gate of the sixth transistor Tr6 is connected to a gate of the fifth transistor Tr5. Further, a drain current of the third transistor Tr3 is controlled by a current flowing in the current source 1351.

Further, the current source 1351 is a current mirror circuit, for example. Accordingly, the current source 1351 applies, to the third transistor Tr3, a current corresponding to the current flowing in the fifth transistor Tr5. More specifically, magnitude of the current flowing in the third transistor Tr3 is substantially the same as or proportional to the current flowing in the fifth transistor Tr5, for example.

In the example depicted in FIG. 21, the current source 1351 of the DC bias voltage generation circuit 135 constitutes a current mirror for the sixth transistor Tr6 which controls a frequency of the ring oscillator 131. According to this configuration, as the current flowing in the sixth transistor Tr6 increases, the current applied by the current source 1351 of the DC bias voltage generation circuit 135 increases in association with the current increase of the sixth transistor Tr6. Accordingly, in a case where a control signal for increasing the frequency of the ring oscillator 131 is applied from the outside (the gate voltage of the sixth transistor Tr6 is increased), the DC bias voltage generation circuit 135 receives information associated with this control signal, and increases the direct current bias voltage in line with FIG. 18. As a result, the characteristics of the ring oscillator 131 are automatically adjusted to a state more suited for a high frequency operation according to the relation presented in FIG. 9.

Moreover, the current source 1351 thus provided can prevent fixation of the gate voltage (bias voltage) of the third transistor Tr3 at a power source voltage. Further, a gate-source voltage $V_{GS}$ of the third transistor Tr3 increases as the current flowing in the current source 1351 increases. In a case where the current source 1351 is linked with the current source of the oscillator (sixth transistor Tr6), the transistor capability can be raised as the oscillation frequency increases. At the time of a low frequency, the transistor capability is not forcibly raised. In such a manner, a problem of inoperability that is caused not at a high frequency but at a low frequency can be reduced.

The terminal TF inputs an oscillation frequency control analog signal to the oscillation frequency control unit 138. In response to this signal, the oscillation frequency control unit 138 changes the parallel number of the fifth transistor Tr5 and the parallel number of the sixth transistor Tr6 to control the oscillation frequency. Moreover, the oscillation frequency control unit 138 controls the parallel number of the third transistor Tr3, the parallel number of the fourth transistor Tr4, and the resistance of the resistance element 1352 according to the oscillation frequency control analog signal, for example.

Note that the oscillation frequency control unit 138 is not limited to the VCCS 132, and may be the REG 133, the DAC 134, or the like depicted in FIGS. 3C, 3D, 3E, and 3F, for example.

[Use Example of Variable Mechanism of VCO]

Figure 22A:
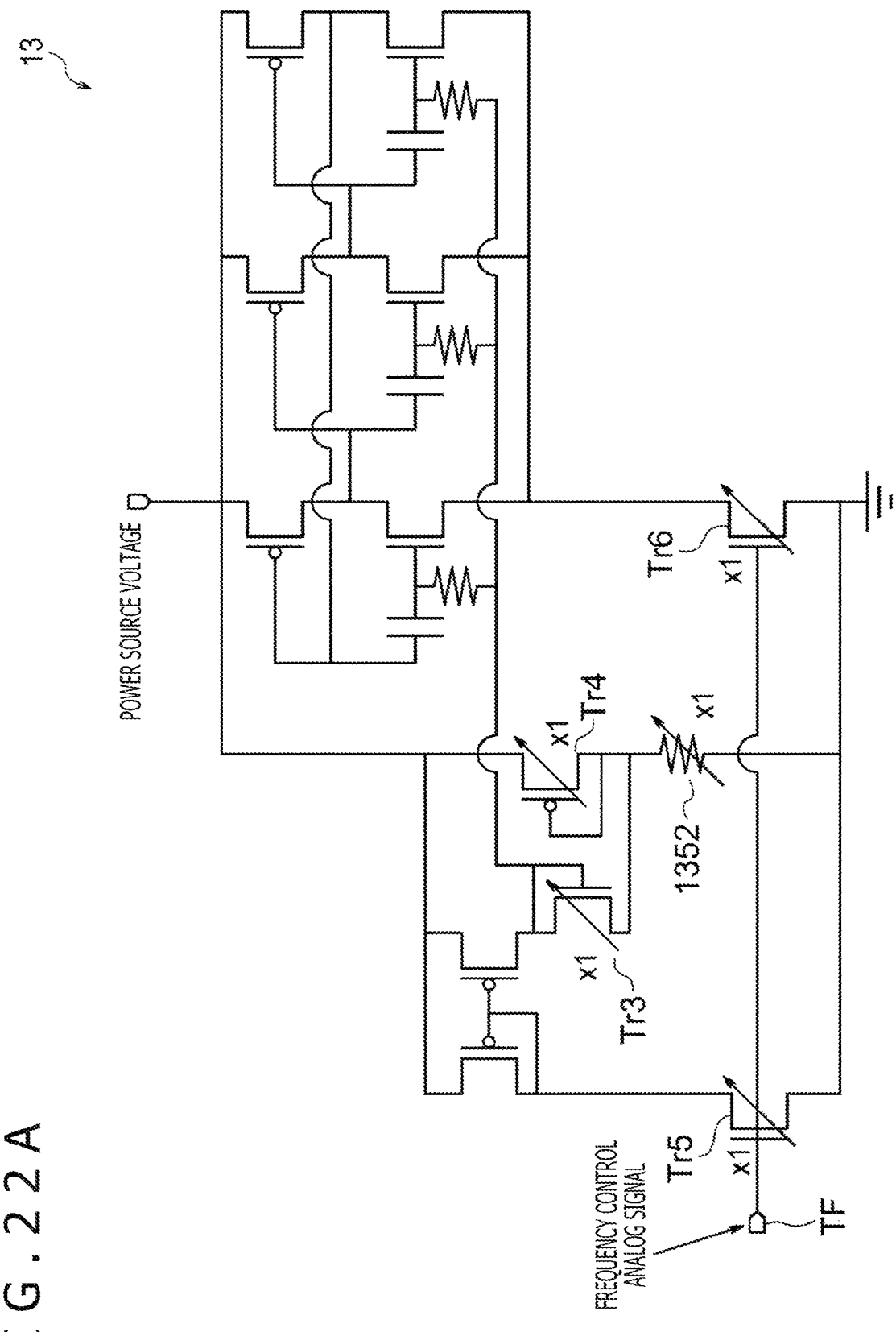
FIG. 22A is a circuit diagram depicting a use example of variable mechanisms of respective configurations included in an oscillation frequency control unit and the bias voltage generation circuit associated with the VCO depicted in FIG. 21.
Figure 22B:
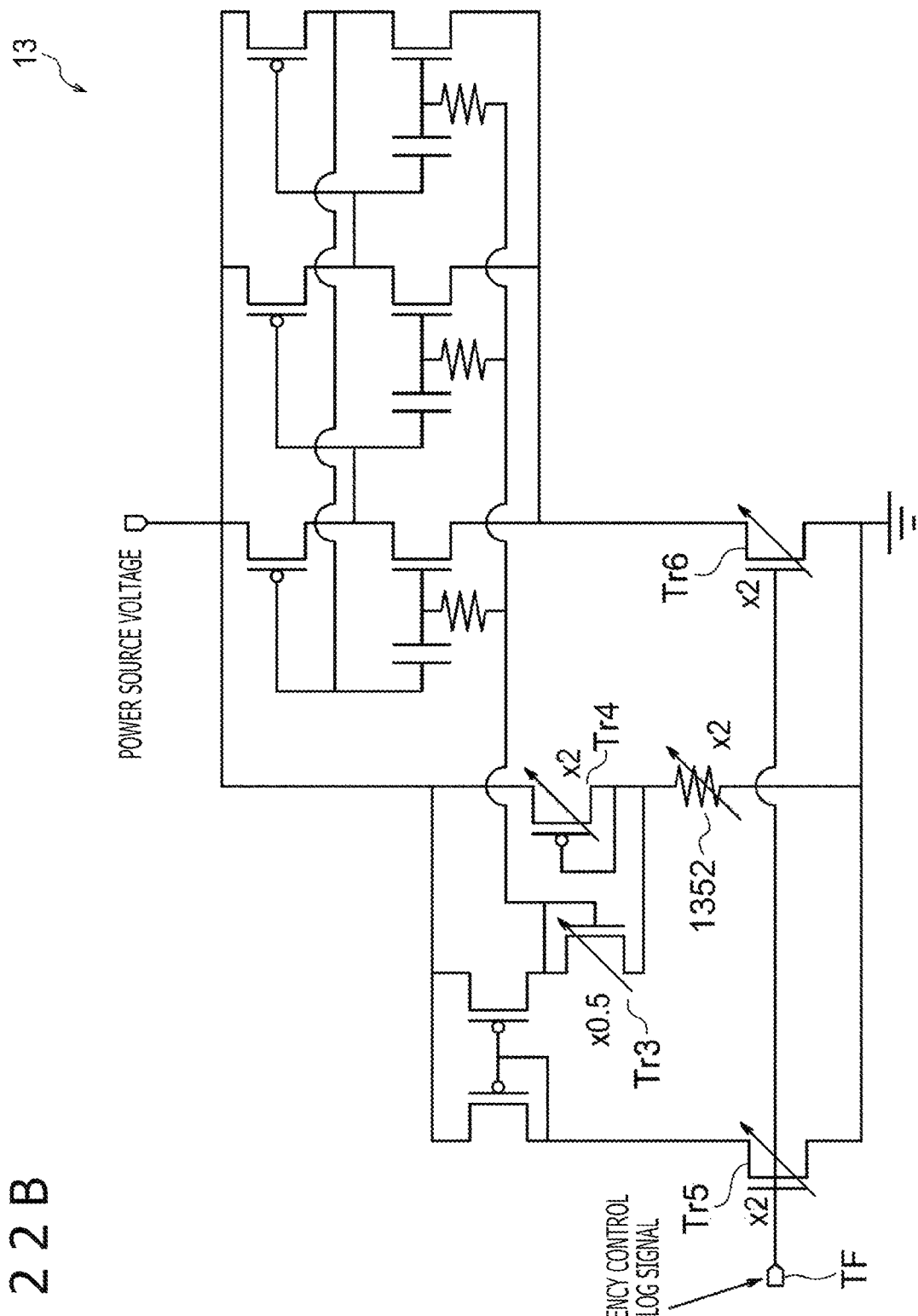
FIG. 22B is a circuit diagram depicting a use example of the variable mechanisms of the respective configurations included in the oscillation frequency control unit and the bias voltage generation circuit associated with the VCO depicted in FIG. 21.
Figure 22C:
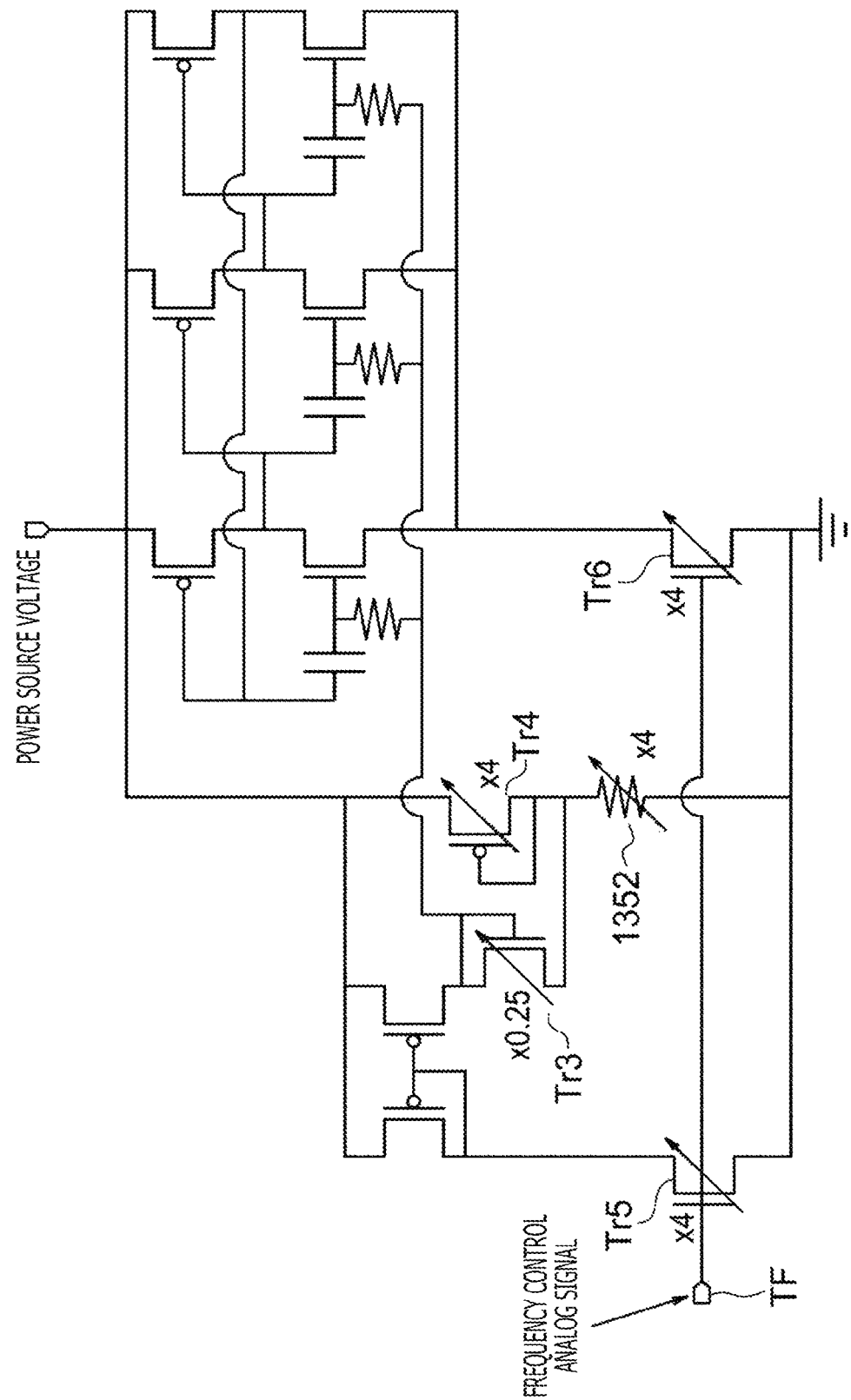
FIG. 22C is a circuit diagram depicting a use example of the variable mechanisms of the respective configurations included in the oscillation frequency control unit and the bias voltage generation circuit associated with the VCO depicted in FIG. 21.

Each of FIGS. 22A, 22B, and 22C is a circuit diagram depicting a use example of the variable mechanisms of the respective configurations included in the oscillation frequency control unit 138 and the DC bias voltage generation circuit 135 associated with the VCO 13 depicted in FIG. 21. FIGS. 22A, 22B, and 22C depict a low-frequency setting, a middle-frequency setting, and a high-frequency setting, respectively In the examples depicted in FIGS. 22A, 22B, and 22C, the parallel numbers of the fifth transistor Tr5, the sixth transistor Tr6, and the fourth transistor Tr4 and the resistance of the resistance element 1352 are doubled from the low-frequency setting to the middle-frequency setting, or from the middle-frequency setting to the high-frequency setting. In addition, the parallel number of the third transistor Tr3 is reduced to a half.

The current supplied to the ring oscillator 131 can be raised by the parallel number of the sixth transistor Tr6 being increased in line with a rise of the frequency to be set. In addition, a bias voltage for a higher frequency is generated by the DC bias voltage generation circuit 135. For example, the PLL circuit 1 capable of widening a frequency range by switching of the setting of the oscillator is providable by adoption of the frequency control oscillators depicted in FIGS. 22A, 22B, and 22C as the PLL circuit 1. Moreover, in a case where the transistor capability is high, the resistance element 1352 may be so controlled as to have a lower resistance value to lower the transistor capability. In this case, noise reduction is achievable, and the characteristics of the oscillator can hence improve.

[Connection Example of PLL Circuit]

Figure 23A:
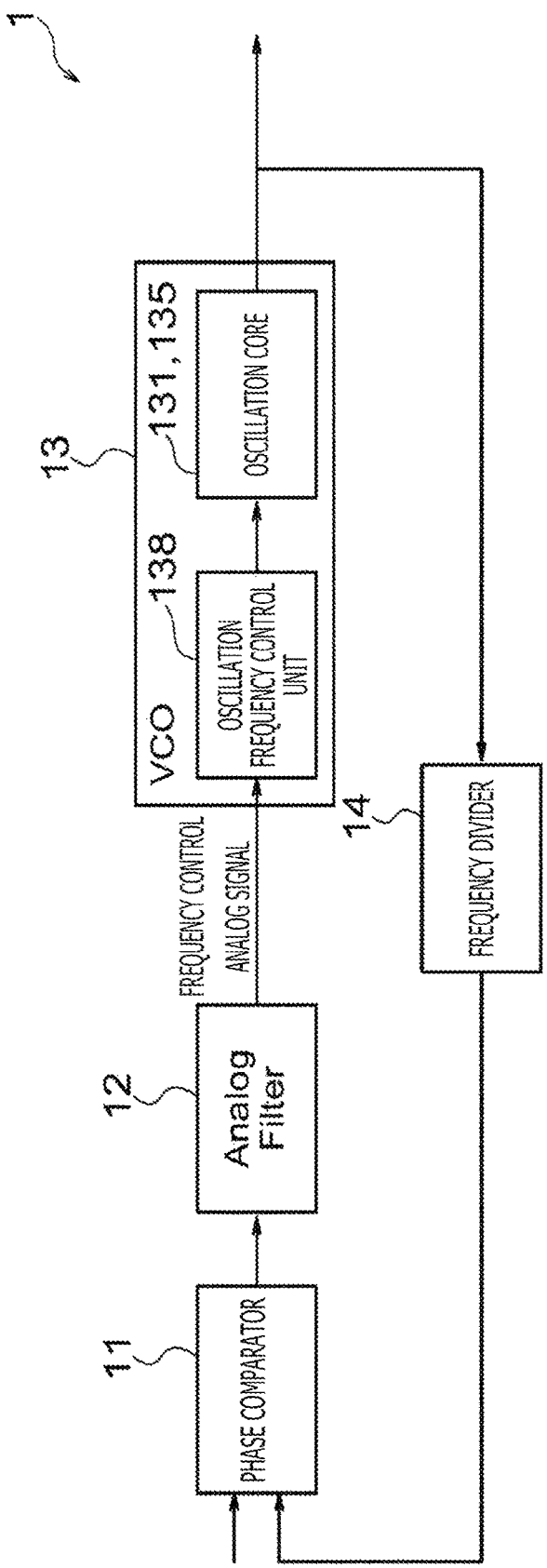
FIG. 23A is a block diagram depicting an example of connection when the ring oscillator is used as a PLL circuit.

FIG. 23A is a block diagram depicting an example of connection when the ring oscillator 131 is used as the PLL circuit 1. FIG. 23A depicts the PLL circuit 1 in FIG. 1. Note that the ring oscillator 131 and the DC bias voltage generation circuit 135 are also collectively referred to as an oscillation core.

Figure 23B:
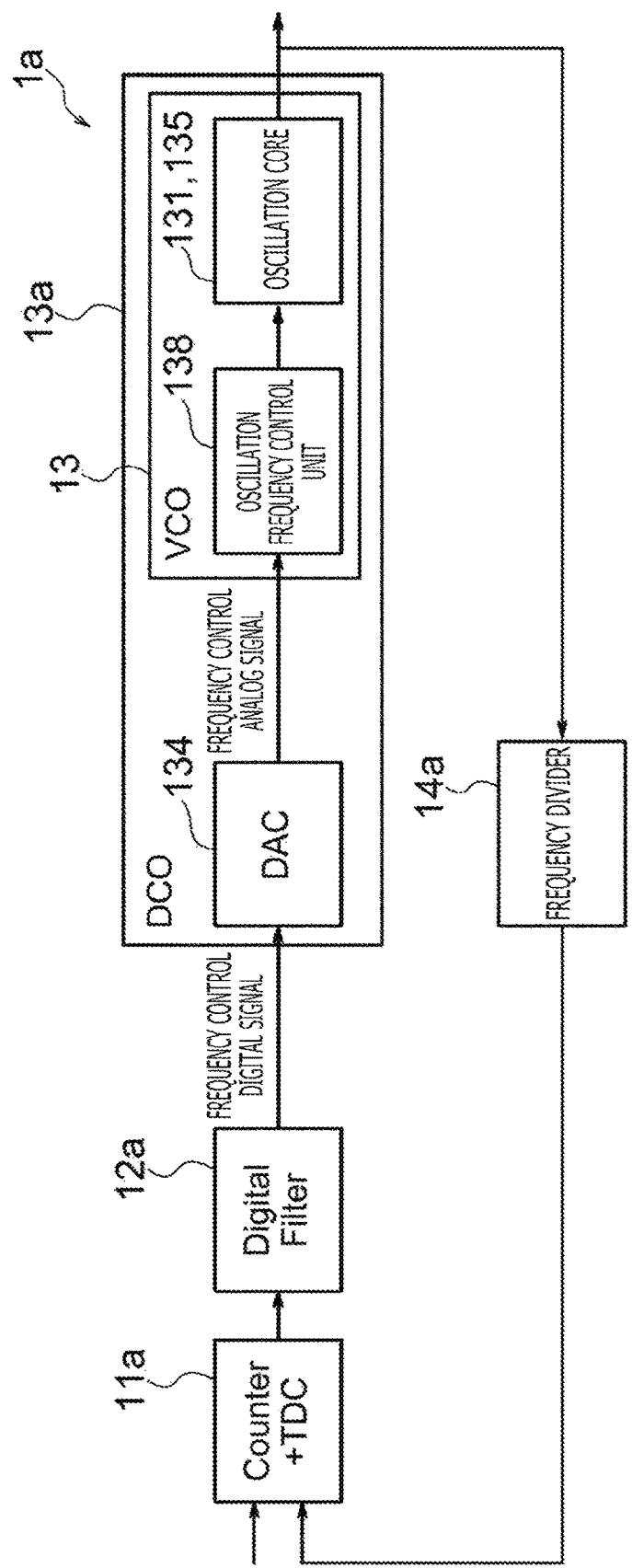
FIG. 23B is a block diagram depicting a modification of connection when the ring oscillator is used as the PLL circuit.

FIG. 23B is a block diagram depicting a modification of connection when the ring oscillator 131 is used as the PLL circuit 1. FIG. 23B depicts the PLL circuit 1a in FIG. 2.

The analog PLL circuit depicted in FIG. 23A and the digital PLL circuit depicted in FIG. 23B are different from each other in terms of a phase comparison circuit and method, for example, but may have a common configuration as the configuration of the ring oscillator 131.

As described above, by adopting the oscillation device (VCO 13) of the present embodiment as the PLL circuit 1, such an oscillation core not only achieving high-speed oscillation operations, but also having a wide-range oscillation frequency variable width is providable.

Figure 24:
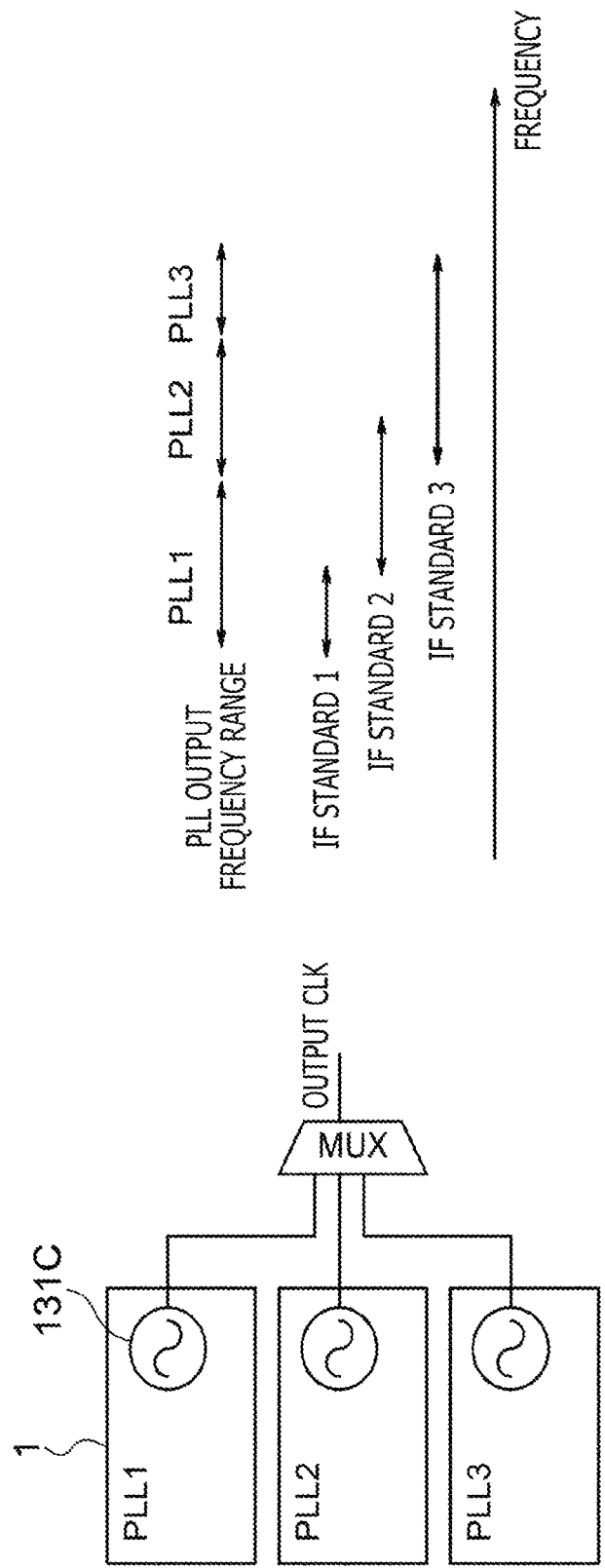
FIG. 24 is a diagram depicting a comparative example of a frequency setting of the PLL circuit.

FIG. 24 is a diagram depicting a comparative example of the frequency setting of the PLL circuit 1. The PLL circuit 1 depicted in FIG. 24 has the ring oscillator 131C of the comparative example depicted in FIG. 7. The ring oscillator 131C does not have the terminal TC, and thus, transistor capability adjustment achieved by supply of a bias voltage or the like is not performed for the ring oscillator 131C. Moreover, each of PLL1 to PLL3 indicates a PLL circuit having a different PLL output frequency range.

In recent years, there is a demand for further improvement of a maximum rate of the PLL circuit 1 to achieve such requirements as higher-speed signal processing and transfer of a larger volume of data. Meanwhile, the PLL circuit 1 of such a type operable even at a low data rate is demanded in some cases to also cover upper compatibility.

According to the example depicted in FIG. 24, a desired data rate or the like is achievable, depending on applications, by a separate use for each, a combination, or other methods of use of the PLL circuits 1 each including an oscillator core having a different oscillation frequency variable width. For example, in a case where a chip corresponding to three IF (interface) standards is required, a chip handling the three IF standards is providable by use of the three PLL circuits 1 each having a different output frequency range as depicted in FIG. 24. In addition, the ring oscillator and the LC oscillator each have an advantage and a disadvantage. For example, the ring oscillator is theoretically capable of achieving wide-range oscillation operations. However, considerable characteristic variation caused by variation in transistor capability of the ring oscillator may prevent wide-range operations. Meanwhile, the LC oscillator is capable of achieving high-speed oscillation operations. However, wide-range oscillation operations are difficult to perform by the LC oscillator due to a control system of the LC oscillator. Accordingly, there may also be such a case where the high-frequency operation covered by the PLL3 in the example depicted in FIG. 24 is difficult to achieve by the ring oscillator. In such a case, use of the ring oscillator for the PLL1 and PLL2 and use of the LC oscillator for the PLL3 for the high-frequency operation are also possible, for example. However, such a method requires a sufficient number of steps for designing multiple PLL circuits 1 and a sufficient chip area for mounting the multiple PLL circuits 1. Accordingly, chip costs increase.

On the other hand, the PLL circuit 1 according to the present embodiment uses an oscillator core not only achieving high-speed oscillation operations, but also having a wide-range oscillation frequency variable width.

Figure 25:
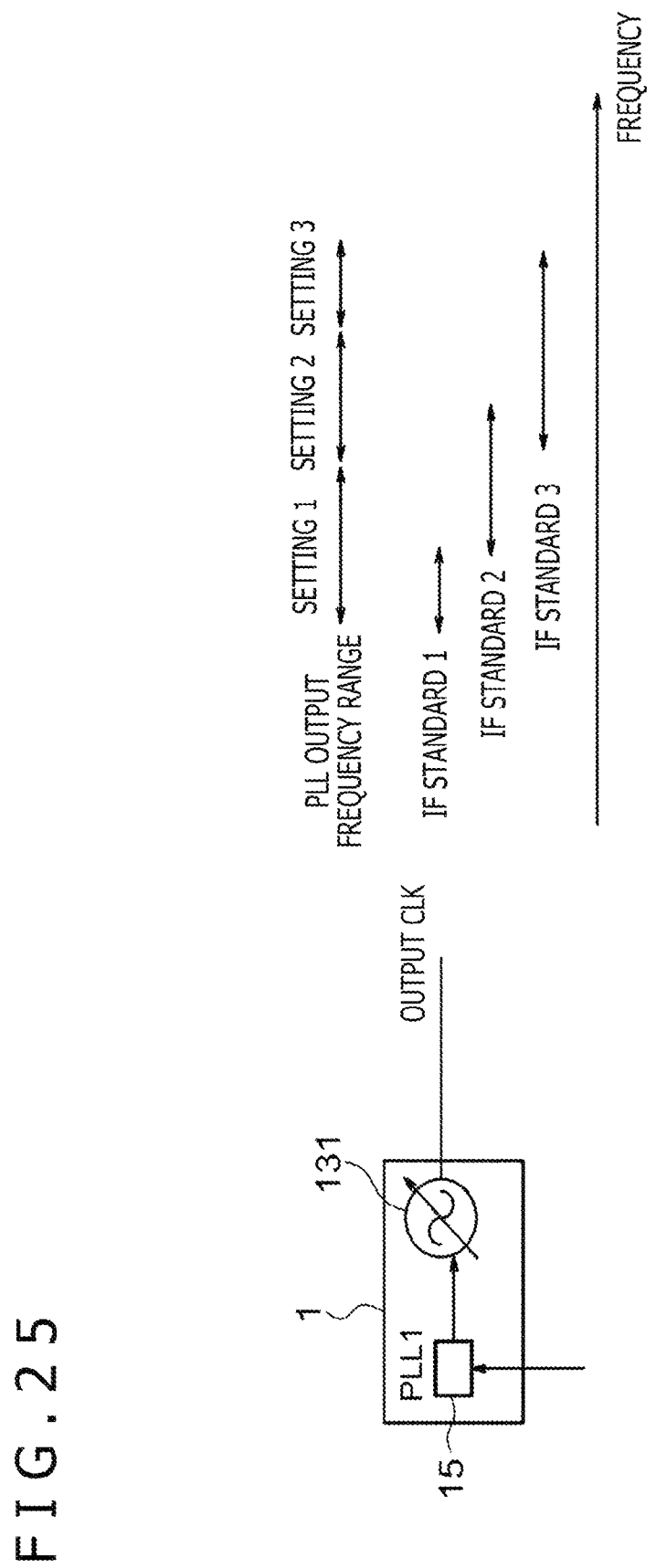
FIG. 25 is a diagram depicting an example of the frequency setting of the PLL circuit.

FIG. 25 is a diagram depicting an example of the frequency setting of the PLL circuit 1.

The PLL circuit 1 further includes a frequency switching unit 15. The frequency switching unit 15 switches a variable range of the oscillation frequency of the oscillation device according to a frequency signal for controlling the oscillation frequency. For example, the frequency signal is the input signal depicted in FIG. 23A. For example, the frequency switching unit 15 receives a signal for switching the variable range from the outside of the PLL circuit 1.

As depicted in FIG. 25, multiple standards are handleable by the single oscillator (ring oscillator 131) in the present embodiment. Moreover, multiple standards (e.g., IF standard 1 to IF standard 3) can be covered by the single oscillator. Furthermore, an operation mode of an application is switchable by use of the single oscillator.

Note that the present technology can have the following configurations.

(1)
An oscillation device including:
multiple delay elements that each sequentially delay an input signal, and return at least some of the delayed signals to a preceding stage to generate an oscillation signal; and
a first control terminal that inputs, to the multiple delay elements, a direct current control signal for collectively controlling direct current voltage levels of the input signal to be input in plural number to the multiple delay elements.

(2)
The oscillation device according to (1), further including:
multiple capacitors connected to input nodes of the multiple delay elements to cut off direct current signal components contained in the multiple input signals.

(3)
The oscillation device according to (1) or (2), in which each of the delay elements includes a transistor having a gate at which the direct current voltage level is adjusted according to the direct current control signal.

(4)
The oscillation device according to (1) or (2), in which
the multiple delay elements include multiple logical inverting circuits connected in a ring shape, and
direct current voltage levels of multiple input signals to be input to the multiple logical inverting circuits are collectively controlled according to the direct current control signal.

(5)
The oscillation device according to (4), in which
each of the logical inverting circuits has a first transistor and a second transistor, each of the first and second transistors being a transistor of a conductive type different from each other and cascode-connected between a first reference voltage node and a second reference voltage node, and
a direct current voltage level at a gate of either the first transistor or the second transistor is set according to the direct current control signal.

(6)
The oscillation device according to (5), further including:
a capacitor connected to and between a gate of the first transistor and a gate of the second transistor to cut off a direct current signal component contained in an output signal from any one of the other logical inverting circuits.

(7)
The oscillation device according to any one of (1) to (6), further including:
a direct current control signal generation unit that generates the direct current control signal according to a drive capability of at least one transistor included in the delay elements.

(8)
The oscillation device according to (7), in which the direct current control signal generation unit adjusts a voltage level of the direct current control signal to be input to a gate of the transistor, to adjust the drive capability of the transistor.

(9)
The oscillation device according to (7) or (8), in which the direct current control signal generation unit includes
a current source and a third transistor that is diode-connected, the current source and the third transistor being connected in series between the first reference voltage node and a first node,
a fourth transistor that is diode-connected and connected to and between the first reference voltage node and the first node, and
a resistance element connected to and between the first node and a second reference voltage node, and
the direct current control signal generation unit outputs the direct current control signal from a gate and a drain of the third transistor that is diode-connected.

(10)
The oscillation device according to (9), in which the direct current control signal generation unit controls the direct current voltage level of the direct current control signal by controlling at least one of a current flowing in the current source, a parallel number of the third transistor, a parallel number of the fourth transistor, and a resistance of the resistance element.

(11)

The oscillation device according to (10), in which, in a case where the third transistor and the fourth transistor are an n-type MOS transistor and a p-type MOS transistor, respectively, the direct current control signal generation unit lowers the direct current voltage level by decreasing the current flowing in the current source, or raises the direct current voltage level by increasing the current flowing in the current source, and in a case where the third transistor and the fourth transistor are a p-type MOS transistor and an n-type MOS transistor, respectively, the direct current control signal generation unit lowers the direct current voltage level by increasing the current flowing in the current source, or raises the direct current voltage level by decreasing the current flowing in the current source.

(12)

The oscillation device according to (10) or (11), in which, in a case where the third transistor and the fourth transistor are an n-type MOS transistor and a p-type MOS transistor, respectively, the direct current control signal generation unit lowers the direct current voltage level by increasing the parallel number of the n-type MOS transistor and decreasing the parallel number of the p-type MOS transistor, or raises the direct current voltage level by decreasing the parallel number of the n-type MOS transistor and increasing the parallel number of the p-type MOS transistor, and in a case where the third transistor and the fourth transistor are a p-type MOS transistor and an n-type MOS transistor, respectively, the direct current control signal generation unit raises the direct current voltage level by decreasing the parallel number of the n-type MOS transistor and increasing the parallel number of the p-type MOS transistor, or lowers the direct current voltage level by increasing the parallel number of the n-type MOS transistor and decreasing the parallel number of the p-type MOS transistor.

(13)

The oscillation device according to any one of (9) to (12) further including:

an oscillation frequency control unit that controls an oscillation frequency of the oscillation signal, in which the oscillation frequency control unit includes a fifth transistor that controls a current flowing in the current source, and a sixth transistor that applies a drain current proportional to a drain current of the fifth transistor, a delay time of each of the multiple delay elements varies according to the drain current of the sixth transistor, and the oscillation frequency control unit controls the current flowing in the current source by controlling a gate voltage of the fifth transistor, and controls the oscillation frequency of the oscillation signal by controlling the delay times of the multiple delay elements.

(14)

The oscillation device according to (13), in which the current flowing in the current source and the drain current of the sixth transistor are controlled according to the gate voltage of the fifth transistor, and a drain current of the third transistor is controlled according to the current flowing in the current source.

(15)

The oscillation device according to any one of (9) to (14), in which each of the third transistor and the fourth transistor has characteristics identical with or similar to characteristics of the transistors contained in the delay elements.

(16)

The oscillation device according to any one of (1) to (15), further including:

a second control terminal that inputs an alternating current control signal that controls alternating current voltage levels of the input signals to be input to the multiple delay elements.

(17)

The oscillation device according to (16), further including:

a noise component detection unit that detects a noise component of a power source voltage supplied to the multiple delay elements; and an alternating current control signal generation unit that generates the alternating current control signal as a signal for cancelling the noise component.

(18)

The oscillation device according to (16), further including:

a noise component detection unit that detects a noise component of the oscillation signal output from the delay elements; and an alternating current control signal generation unit that generates the alternating current control signal as a signal for cancelling the noise component.

(19)

A PLL circuit including:

an oscillation device that controls an oscillation frequency of an oscillation signal according to a phase difference from a reference signal; and a phase comparator that detects a phase difference between the reference signal and the oscillation signal, in which the oscillation device includes multiple delay elements that each sequentially delay an input signal, and return at least some of the delayed signals to a preceding stage to generate the oscillation signal, and a first control terminal that inputs, to the multiple delay elements, a direct current control signal for collectively controlling direct current voltage levels of the input signal to be input in plural number to the multiple delay elements.

Modes of the present disclosure are not limited to the respective embodiments described above, and include various modifications which may be arrived at by those skilled in the art. In addition, advantageous effects of the present disclosure are not limited to the contents described above. Specifically, various additions, modifications, and partial eliminations may be made without departing from the scope of the conceptual idea and spirit of the present disclosure derived from contents and equivalents of the contents specified in the claims.

REFERENCE SIGNS LIST

1: PLL circuit
13: VCO
13a: DCO
131: Ring oscillator
1311: Delay element
1312: Capacitor
135: DC bias voltage generation circuit 1351: Current source
1352: Resistance element
1353: n-type MOS transistor
1354: p-type MOS transistor
136: Noise component detection circuit
137: AC bias signal generation circuit
138: Oscillation frequency control unit
15: Frequency switching unit
Nin: Input node
N1: First node
RV1: First reference voltage node
RV2: Second reference voltage node
TA to TF: Terminal
Tr1: First transistor
Tr2: Second transistor
Tr3: Third transistor
Tr4: Fourth transistor
Tr5: Fifth transistor
Tr6: Sixth transistor

The invention claimed is:

1. An oscillation device, comprising:
a direct current control signal generation unit that includes a current source, a first transistor, a first reference voltage node, and a first node, wherein the first transistor includes a first gate and a drain;
a plurality of delay elements, wherein each of the plurality of delay elements is configured to:
sequentially delay a respective input signal of a plurality of input signals;
return a plurality of delayed signals to a preceding stage; and
generate an oscillation signal based on the plurality of delayed signals; and
a first control terminal configured to:
input, to the plurality of delay elements, a direct current control signal; and
control a plurality of direct current voltage levels of the respective input signal based on the direct current control signal,
wherein
the first transistor is diode-connected,
the current source and the first transistor are connected in series between the first reference voltage node and the first node, and
the direct current control signal generation unit is configured to output the direct current control signal from the first gate of the first transistor and the drain of the first transistor.

2. The oscillation device according to claim 1, further comprising:
a plurality of input nodes; and
a plurality of capacitors connected to the plurality of input nodes, wherein
the plurality of input nodes is associated with the plurality of delay elements,
the plurality of input signals comprises a plurality of direct current signal components, and
the plurality of capacitors is configured to cut off the plurality of direct current signal components.

3. The oscillation device according to claim 1, wherein
each of the plurality of delay elements includes a second transistor,
the second transistor comprises having a second gate, and
a direct current voltage level of the plurality of direct current voltage levels is adjustable at the second gate of the second transistor based on the direct current control signal.

4. The oscillation device according to claim 1, wherein
the plurality of delay elements includes a plurality of logical inverting circuits,
the plurality of delay elements are connected in a ring shape,
the plurality of direct current voltage levels is associated with the plurality of input signals,
the plurality of input signals are input to the plurality of logical inverting circuits, and
the plurality of input signals is controlled based on the direct current control signal.

5. The oscillation device according to claim 4, wherein
the direct current control signal generation unit further includes a second reference voltage node,
each of the plurality of logical inverting circuits comprises a second transistor and a third transistor different from the second transistor,
each of the second transistor and the third transistor is a transistor of a conductive type,
the second transistor and the third transistor are cascode-connected between the first reference voltage node and the second reference voltage node,
a direct current voltage level of the plurality of direct current voltage levels is set based on the direct current control signal, and
the direct current voltage level is at one of a second gate of the second transistor or a third gate of the third transistor.

6. The oscillation device according to claim 5, further comprising:
a capacitor connected to the second gate of the second transistor and the third gate of the third transistor, wherein
one of the plurality of logical inverting circuits is configured to output an output signal,
the output signal comprises a direct current signal component, and
the capacitor is configured to cut off the direct current signal component.

7. The oscillation device according to claim 1, wherein
the plurality of delay elements comprises a second transistor, and
the direct current control signal generation unit is further configured to generate the direct current control signal based on a drive capability of the second transistor.

8. The oscillation device according to claim 7, wherein the direct current control signal generation unit is further configured to adjust a voltage level of the direct current control signal based on the drive capability of the second transistor.

9. The oscillation device according to claim 1, wherein the direct current control signal generation unit further includes:
a second reference voltage node;
a second transistor connected to the first reference voltage node and the first node, wherein the second transistor is diode-connected; and
a resistance element connected to the first node and the second reference voltage node.

10. The oscillation device according to claim 9, wherein the direct current control signal generation unit is further configured to control a direct current voltage level of the plurality of direct current voltage levels based on at least one of a current that flows in the current source, a parallel number of the first transistor, a parallel number of the second transistor, or a resistance of the resistance element.

11. The oscillation device according to claim 10, wherein based on the first transistor being an n-type MOS transistor and the second transistor being a p-type MOS transistor, the direct current control signal generation unit is further configured to:
lower the direct current voltage level based on a decrease in the current that flows in the current source; or
raise the direct current voltage level based on an increase in the current that flows in the current source, and
based on the first transistor being the p-type MOS transistor and the second transistor being the n-type MOS transistor, the direct current control signal generation unit is further configured to:
lower the direct current voltage level based on the increase in the current that flows in the current source, or
raise the direct current voltage level based on the decrease in the current that flows in the current source.

12. The oscillation device according to claim 10, wherein
based on the first transistor being an n-type MOS transistor and the second transistor being a p-type MOS transistor, the direct current control signal generation unit is further configured to:
lower the direct current voltage level based on an increase in the parallel number of the first transistor and a decrease in the parallel number of the second transistor, or
raise the direct current voltage level based on a decrease in the parallel number of the first transistor and an increase in the parallel number of the second transistor, and
based on the first transistor being the p-type MOS transistor and the second transistor being the n-type MOS transistor, the direct current control signal generation unit is further configured to:
raise the direct current voltage level based on the decrease in the parallel number of the first transistor and the increase in the parallel number of the second transistor, or
lower the direct current voltage level based on the increase in the parallel number of the first transistor and the decrease in the parallel number of the second transistor.

13. The oscillation device according to claim 9, further comprising:
an oscillation frequency control unit configured to control an oscillation frequency of the oscillation signal, wherein
the oscillation frequency control unit includes:
a third transistor configured to control a current that flows in the current source, and
a fourth transistor configured to apply a first drain current,
the first drain current is proportional to a second drain current of the third transistor,
a delay time of each of the plurality of delay elements varies based on the first drain current, and
the oscillation frequency control unit is further configured to:
control the current that flows in the current source based on a gate voltage of the third transistor; and
control the oscillation frequency of the oscillation signal controlling based on the delay time of each of the plurality of delay elements.

14. The oscillation device according to claim 13, wherein the oscillation frequency control unit is further configured to control a third drain current of the first transistor based on the current that flows in the current source.

15. The oscillation device according to claim 9, wherein the plurality of delay elements further comprises a plurality of transistors, and
characteristics of each of the first transistor and the second transistor are identical with or similar to characteristics of the plurality of transistors.

16. The oscillation device according to claim 1, further comprising:
a second control terminal configured to input an alternating current control signal to the plurality of delay elements, wherein
a plurality of alternating current voltage levels is controlled based on the alternating current control signal, and
the plurality of alternating current voltage levels is associated with the plurality of input signals.

17. The oscillation device according to claim 16, further comprising:
a noise component detection unit configured to detect a noise component of a power source voltage supplied to the plurality of delay elements; and
an alternating current control signal generation unit configured to:
generate the alternating current control signal; and
cancel the noise component based on the alternating current control signal.

18. The oscillation device according to claim 16, further comprising:
a noise component detection unit configured to detect a noise component of the oscillation signal; and
an alternating current control signal generation unit configured to:
generate the alternating current control signal; and
cancel the noise component based on the alternating current control signal.

19. A phase locked loop (PLL) circuit, comprising:
a phase comparator configured to detect a phase difference between a reference signal and an oscillation signal; and
an oscillation device configured to control, based on the phase difference, an oscillation frequency of the oscillation signal wherein
the oscillation device includes:
a direct current control signal generation unit that includes a current source, a transistor, a reference voltage node, and a node;
a plurality of delay elements, wherein each of the plurality of delay elements is configured to:
sequentially delay a respective input signal of a plurality of input signals;
return a plurality of delayed signals to a preceding stage; and
generate the oscillation signal based on the plurality of delayed signals; and
a control terminal that is configured to:
input, to the plurality of delay elements, a direct current control signal; and
control a plurality of direct current voltage levels of the respective input signal based on the direct current control signal,
the transistor is diode-connected,
the current source and the transistor are connected in series between the reference voltage node and the node, and the direct current control signal generation unit is configured to output the direct current control signal from a gate of the transistor and a drain of the transistor.

* * * * *